United States Patent
Hwang et al.

(10) Patent No.: US 12,519,089 B2
(45) Date of Patent: Jan. 6, 2026

(54) COLOR CONVERSION STRUCTURE INCLUDING QUANTUM DOT LAYER, DISPLAY APPARATUS INCLUDING THE COLOR CONVERSION STRUCTURE, AND METHOD OF MANUFACTURING DISPLAY APPARATUS INCLUDING THE COLOR CONVERSION STRUCTURE

(71) Applicant: SAMSUNG ELECTRONICS CO., LTD., Suwon-si (KR)

(72) Inventors: Kyungwook Hwang, Seoul (KR); Joonyong Park, Suwon-si (KR); Dongho Kim, Seoul (KR); Hyunjoon Kim, Seoul (KR); Seogwoo Hong, Yongin-si (KR); Junsik Hwang, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 577 days.

(21) Appl. No.: 17/708,332

(22) Filed: Mar. 30, 2022

(65) Prior Publication Data

US 2022/0328733 A1    Oct. 13, 2022

(30) Foreign Application Priority Data

Apr. 7, 2021 (KR) .................. 10-2021-0045518
Jun. 22, 2021 (KR) .................. 10-2021-0081041

(51) Int. Cl.
*H01L 25/075* (2006.01)
*B82Y 20/00* (2011.01)
(Continued)

(52) U.S. Cl.
CPC .......... *H01L 25/0753* (2013.01); *C09K 11/02* (2013.01); *H10H 20/812* (2025.01);
(Continued)

(58) Field of Classification Search
CPC . H01L 33/507; H01L 25/0753; H01L 33/502; H01L 33/60; H10K 59/90;
(Continued)

(56) References Cited

U.S. PATENT DOCUMENTS 9,773,955 B2 * 9/2017 Jeon .................. G02B 6/0073
10,297,581 B2   5/2019 Steckel et al.
(Continued)

FOREIGN PATENT DOCUMENTS

CN    102044624 A    5/2011
CN    106195921 A    12/2016
(Continued)

OTHER PUBLICATIONS

European Search Report issued Sep. 6, 2022 by the European Patent Office in EP Patent Application No. 22164782.9.
(Continued)

*Primary Examiner* — Alonzo Chambliss
(74) *Attorney, Agent, or Firm* — Sughrue Mion, PLLC

(57) ABSTRACT

Disclosed are a color conversion structure, a display apparatus, and a method of manufacturing the display apparatus. The color conversion structure has a transferable film structure which includes a base layer and a quantum dot layer provided on the base layer.

25 Claims, 34 Drawing Sheets

(51) Int. Cl.
  *B82Y 40/00*    (2011.01)
  *C09K 11/02*    (2006.01)
  *H10H 20/812*   (2025.01)
  *H10H 20/825*   (2025.01)
  *H10H 20/851*   (2025.01)
  *H10H 20/01*        (2025.01)
  *H10H 20/80*        (2025.01)
  *H10H 20/856*       (2025.01)
  *H10K 50/115*       (2023.01)
  *H10K 59/80*        (2023.01)
  *H10K 59/90*        (2023.01)

(52) U.S. Cl.
  CPC ...... *H10H 20/825* (2025.01); *H10H 20/8512* (2025.01); *H10H 20/8515* (2025.01); *B82Y 20/00* (2013.01); *B82Y 40/00* (2013.01); *H10H 20/0361* (2025.01); *H10H 20/856* (2025.01); *H10H 20/882* (2025.01); *H10K 50/115* (2023.02); *H10K 59/873* (2023.02); *H10K 59/90* (2023.02)

(58) Field of Classification Search
  CPC ........... H10K 2102/331; H10K 59/873; C09K 11/02; B82Y 40/00; B82Y 20/00; H10H 20/8515; H10H 20/8512; H10H 20/825; H10H 20/812
  See application file for complete search history.

(56) References Cited

U.S. PATENT DOCUMENTS

| | | | | |
|---|---|---|---|---|
| 10,495,923 | B2* | 12/2019 | Han | H10D 86/40 |
| 10,608,150 | B2  | 3/2020  | Yuasa et al. | |
| 10,976,610 | B2* | 4/2021  | Kim | G02F 1/133603 |
| 11,063,192 | B2* | 7/2021  | Tamaki | H10H 20/856 |
| 2009/0217967 | A1* | 9/2009 | Hovel | H01L 31/022425 |
| | | | | 438/73 |
| 2010/0187501 | A1* | 7/2010 | Toda | H10F 77/146 |
| | | | | 438/63 |
| 2011/0203650 | A1* | 8/2011 | Furusawa | H10F 77/162 |
| | | | | 257/E31.034 |
| 2012/0007043 | A1* | 1/2012 | Yokoyama | H10H 20/822 |
| | | | | 257/9 |
| 2012/0085400 | A1* | 4/2012 | Arena | H01L 21/0237 |
| | | | | 438/93 |
| 2013/0299861 | A1 | 11/2013 | Qi et al. | |
| 2014/0054540 | A1* | 2/2014 | Zhou | H01L 31/18 |
| | | | | 438/22 |
| 2016/0161065 | A1 | 6/2016 | Sung et al. | |
| 2016/0380158 | A1 | 12/2016 | Sasaki et al. | |
| 2017/0255056 | A1* | 9/2017 | Liu | G02F 1/133617 |
| 2019/0296196 | A1 | 9/2019 | Oh et al. | |
| 2020/0041085 | A1 | 2/2020 | Miyairi et al. | |
| 2020/0152841 | A1 | 5/2020 | Han et al. | |
| 2020/0343230 | A1* | 10/2020 | Sizov | H01L 25/167 |
| 2020/0393611 | A1* | 12/2020 | Ryu | G02B 6/0076 |
| 2021/0057607 | A1 | 2/2021 | Lin et al. | |
| 2021/0151496 | A1 | 5/2021 | Wang et al. | |
| 2022/0013400 | A1 | 1/2022 | Hwang et al. | |
| 2022/0328737 | A1 | 10/2022 | An et al. | |
| 2023/0104432 | A1* | 4/2023 | Nakajima | G02F 1/133602 |
| | | | | 257/98 |

FOREIGN PATENT DOCUMENTS

| | | | | |
|---|---|---|---|---|
| CN | 110808262 | A | 2/2020 | |
| CN | 111052418 | A | 4/2020 | |
| CN | 112133718 | A | 12/2020 | |
| JP | 2019-45609 | A | 3/2019 | |
| JP | 2020-25063 | A | 2/2020 | |
| JP | 2020-529729 | A | 10/2020 | |
| JP | 2020-204759 | A | 12/2020 | |
| KR | 10-1567900 | B1 | 11/2015 | |
| KR | 10-2017-0013828 | A | 2/2017 | |
| KR | 10-2018-0136037 | A | 12/2018 | |
| KR | 10-2019-0112623 | A | 10/2019 | |
| KR | 10-2020-0145951 | A | 12/2020 | |
| WO | 2012041180 | A1 | 4/2012 | |
| WO | WO-2014088667 | A2 * | 6/2014 | ......... H01L 27/3225 |
| WO | 2019027820 | A1 | 2/2019 | |
| WO | 2020/029657 | A1 | 2/2020 | |

OTHER PUBLICATIONS

Office Action issued on Dec. 24, 2024 by the Chinese Patent Office in corresponding CN Patent Application No. 202210350284.1.
Office Action issued Jan. 9, 2025 by the Korean Patent Office for KR Patent Application No. 10-2022-0043080.
Communication dated Jul. 15, 2025 issued by the Chinese Intellectual Property Office in counterpart Chinese Application No. 202210350284.1.
Communication issued Jun. 10, 2025 by the Korean Intellectual Property Office in counterpart Korean Patent Application No. 10-2022-0043080.

\* cited by examiner

COLOR CONVERSION STRUCTURE INCLUDING QUANTUM DOT LAYER, DISPLAY APPARATUS INCLUDING THE COLOR CONVERSION STRUCTURE, AND METHOD OF MANUFACTURING DISPLAY APPARATUS INCLUDING THE COLOR CONVERSION STRUCTURE

CROSS-REFERENCE TO RELATED APPLICATION

This application is based on and claims priority to Korean Patent Application No. 10-2021-0045518, filed on Apr. 7, 2021, in the Korean Intellectual Property Office, and Korean Patent Application No. 10-2021-0081041, filed on Jun. 22, 2021, in the Korean Intellectual Property Office, the disclosures of which are incorporated by reference herein in their entireties.

BACKGROUND

1. Field

The disclosure relates to color conversion structures configured to be transferred to a display substrate, display apparatuses, and methods of manufacturing the display apparatuses.

2. Description of the Related Art

Liquid crystal displays (LCDs) and organic light emitting diode (OLED) displays are widely used as display apparatuses. Recently, there is increasing interest in techniques for manufacturing high-resolution display apparatuses using micro semiconductor emitting devices.

Displays using micro semiconductor emitting devices require many techniques such as a technique for transferring micro-sized light emitting diodes to display pixel positions, a technique for repairing micro-sized light emitting diodes, and a method of realizing desired colors.

SUMMARY

Provided are color conversion structures configured to be transferred to a display substrate.

Provided are display apparatuses, each including color conversion structures configured to be transferred to a display substrate.

Provided are methods of manufacturing display apparatuses by transferring color conversion structures to a display substrate.

Additional aspects will be set forth in part in the description which follows and, in part, will be apparent from the description, or may be learned by practice of the presented embodiments of the disclosure.

According to an aspect of the disclosure, there is provided a color conversion structure including: a base layer, and a quantum dot layer provided on the base layer.

The quantum dot layer may include a porous layer, and a plurality of quantum dots embedded in the porous layer.

The porous layer may include n-GaN.

The base layer may have a first width equal to a second width of the quantum dot layer.

The color conversion structure may further include a protection layer which surrounds the quantum dot layer.

The color conversion structure may further include a protrusion provided on an edge of the protection layer.

The color conversion structure may further include a protrusion provided on the quantum dot layer.

The quantum dot layer may include a first surface facing the base layer, a second surface opposite to the first surface, and a third surface forming a lateral surface between the first surface and the second surface, and the protrusion may be provided in a region corresponding to an edge of the second surface of the quantum dot layer or in a region corresponding to the edge of the second surface and the third surface of the quantum dot layer.

The quantum dot layer may include a first surface facing the base layer and a second surface opposite to the first surface, and the protrusion may include a pattern provided in a region corresponding to the second surface.

The base layer may include SiO2, SiN, or GaN.

According to another aspect of the disclosure, there is provided a display apparatus including: a display substrate, a plurality of barrier ribs provided on the display substrate, the plurality of barrier ribs being spaced apart from each other, a micro semiconductor emitting device provided in a groove defined by adjacent barrier ribs among the plurality of barrier ribs and a color conversion structure provided on the micro semiconductor emitting device, the color conversion structure comprising a base layer and a quantum dot layer provided on the base layer.

The groove may include a first groove, a second groove, and a third groove, and the first groove, the second groove, and the third groove may have different cross-sectional shapes or different cross-sectional sizes from one another.

The color conversion structure may be spaced apart from the barrier ribs with a gap between the color conversion structure.

The base layer may be arranged toward the micro semiconductor emitting device.

The micro semiconductor emitting device may include a micro light emitting diode or an organic light emitting diode According to another aspect of the disclosure, there is provided a method of manufacturing a display apparatus, the method including: forming a first layer on a substrate; forming base layers spaced apart from each other by etching the first layer; forming quantum dot layers on the base layers; separating a plurality of color conversion structures from each other by removing the first substrate, each of the plurality of color conversion structures including a base layer, from among the base layers, and a quantum dot layer, from among the quantum dot layers; forming a plurality of barrier ribs on a display substrate; transferring a plurality of micro semiconductor emitting devices in a plurality of grooves defined by the plurality of barrier ribs; and transferring the color conversion structures on the plurality of micro semiconductor emitting devices into the grooves.

According to another aspect of the disclosure, there is provided a color conversion structure including: a quantum dot layer, a base layer provided on the quantum dot layer, the base layer configured to separate the quantum dot layer from a micro semiconductor emitting device, a protection layer which surrounds the quantum dot layer and a protrusion provided on the quantum dot layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
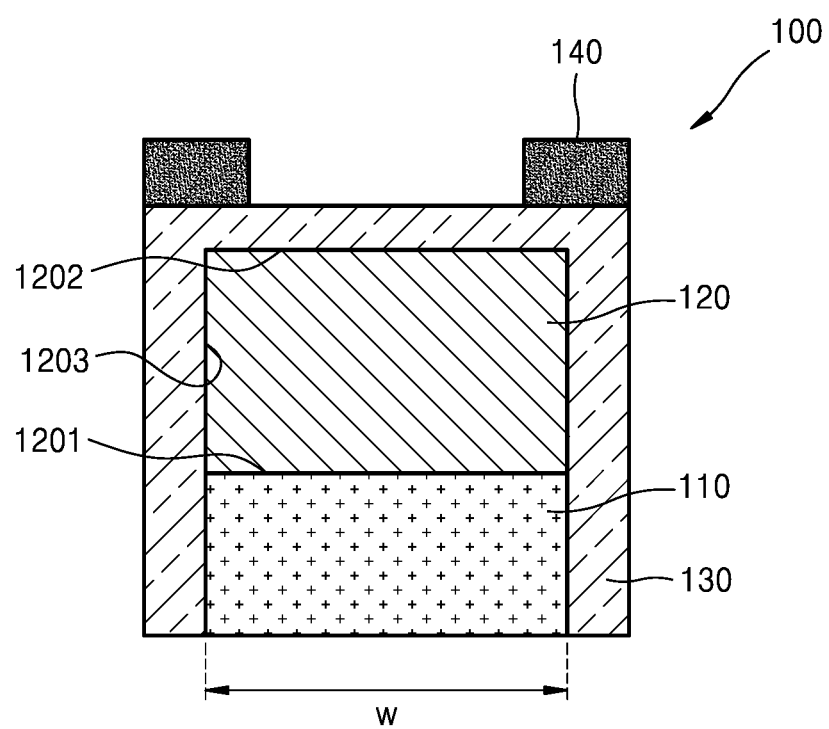
FIG. 1 is a schematic cross-sectional view illustrating a color conversion structure according to an example embodiment.

Reference will now be made in detail to embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, color conversion structures, display apparatuses, and methods of manufacturing display apparatuses will be described according to various embodiments with reference to the accompanying drawings. In the drawings, like reference numbers refer to like elements, and the size of each element may be exaggerated for clarity of illustration. It will be understood that although the terms "first," "second," etc. may be used herein to describe various components, these components should not be limited by these terms. These terms are only used to distinguish one element from another.

As used herein, singular forms may include plural forms as well unless the context clearly indicates otherwise. It will be further understood that the terms "comprises," "comprising," "includes," and/or "including" used herein specify the presence of stated features or elements, but do not preclude the presence or addition of one or more other features or elements. In the drawings, the size or thickness of each element may be exaggerated for clarity of illustration. Furthermore, it will be understood that when a material layer is referred to as being "on" or "above" a substrate or another layer, it can be directly on the substrate or the other layer, or intervening layers may also be present. Furthermore, in the following embodiments, a material included in each layer is an example, and another material may be used in addition to or instead of the material.

In the disclosure, terms such as "unit" or "module" may be used to denote a unit that has at least one function or operation and is implemented with hardware, software, or a combination of hardware and software.

Specific executions described herein are merely examples and do not limit the scope of the inventive concept in any way. For simplicity of description, other functional aspects of conventional electronic configurations, control systems, software and the systems may be omitted. Furthermore, line connections or connection members between elements depicted in the drawings represent functional connections and/or physical or circuit connections by way of example, and in actual applications, they may be replaced or embodied as various additional functional connections, physical connections or circuit connections.

An element referred to with the definite article or a demonstrative pronoun may be construed as the element or the elements even though it has a singular form.

Operations of a method may be performed in appropriate order unless explicitly described in terms of order or described to the contrary. In addition, examples or exemplary terms (for example, "such as" and "etc.") are used for the purpose of description and are not intended to limit the scope of the inventive concept unless defined by the claims.

FIG. 1 is a view illustrating a color conversion structure 100 according to an example embodiment.

The color conversion structure 100 may include a base layer 110 and a quantum dot layer 120 provided on the base layer 110. The base layer 110 may include, for example, $SiO_2$, SiN, or GaN. Alternatively, the base layer 110 may include the same material as the quantum dot layer 120. The base layer 110 may have a function of separating the quantum dot layer 120 from a micro semiconductor emitting device (described later) to prevent direct contact between the quantum dot layer 120 and the micro semiconductor emitting device. In addition, the base layer 110 may have a film shape for transferring of the quantum dot layer 120. The base layer 110 may have the same width (w) as the quantum dot layer 120. Because the color conversion structure 100 formed by arranging the quantum dot layer 120 on the base layer 110 is separated as a transferable unit, the base layer 110 and the quantum dot layer 120 may have the same width (w). For example, the width (w) may be greater than about 0 μm and may be equal to or less than about 300 μm. However, according to various example embodiments, depending on the method of manufacturing the color conversion structure 100, the quantum dot layer 120 and the base layer 110 may have different widths.

The quantum dot layer 120 may include quantum dots. The quantum dots may be inorganic material particles each having a size of several nanometers (nm) and an energy bandgap corresponding to a specific wavelength, such that when the quantum dots absorb light having energy greater than the energy gap, the quantum dots may emit light having a different wavelength. The quantum dots have a narrow emission wavelength band and may thus improve the color reproducibility of a display. However, when the quantum dots are in direct contact with a light emitting source (ultraviolet (UV) or blue light emitting diode (LED)), the quantum dots may be very unstable and have poor color efficiency. When the quantum dots are exposed to intense light or subjected to thermal shock, the properties of the quantum dots may markedly deteriorate. That is, the quantum dots may operate normally when the quantum dots are spaced apart from a light emitting source by a certain distance. The quantum dot layer 120 may be separated from a light emitting source (described later) owing to the base layer 110. Accordingly, deterioration of the quantum dot layer 120 due to light from the light emitting source may be prevented.

The quantum dot layer 120 may have, for example, a film type in which quantum dots are distributed in a photoresist. The quantum dots may have a core-shell structure having a core and a shell, or may have a particle structure not having a shell. The core-shell structure may be a single-shell structure or a multi-shell structure such as a double-shell structure.

The quantum dots may include a Group II-VI semiconductor material, a Group III-V semiconductor material, a Group IV-VI semiconductor, a Group IV semiconductor, and/or graphene quantum dots. The quantum dots may include, for example, cadmium (Cd), selenium (Se), zinc (Zn), sulfur (S), and/or InP, and each of quantum dots may have a diameter of several tens of nanometers (nm) or less, for example, a diameter of about 10 nm or less. When excited by blue light, the quantum dots may emit green or red light depending on the material or size of the quantum dots.

A protection layer 130 may surround the quantum dot layer 120. The protection layer 130 may extend from a lateral surface of the quantum dot layer 120 to a lateral surface of the base layer 110. According to an example embodiment, the protection layer 130 may be provided to cover or surround a top surface of the quantum dot layer 120 and one or more side surfaces of the quantum dot layer 120. Moreover, the protection layer 130 may be provided to cover or surround one or more side surfaces of the base layer 110. Because the quantum dots are vulnerable to moisture, the protection layer 130 is provided on the quantum dot layer 120 to improve reliability and decrease cost by reducing consumption of the quantum dots. The protection layer 130 may include, for example, $AL_2O_3$, $SiO_2$, or SiN.

In micro semiconductor emitting device displays, green micro semiconductor emitting devices and red micro semiconductor emitting devices have low light-emitting efficiency and are expensive compared to blue micro semiconductor emitting devices. Therefore, when color images are formed by converting blue light emitted from blue micro semiconductor emitting devices into green or red light using color conversion structures, the light-emitting efficiency of micro semiconductor emitting device displays may increase, and the manufacturing costs of micro semiconductor emitting device displays may reduce.

According to an example embodiment, the color conversion structure 100 may have a film structure which improves the reliability of the quantum dot layer 120, increases the efficiency of light conversion, and is configured to be transferred to a micro semiconductor emitting device display apparatus.

The quantum dot layer 120 may include a first surface 1201 facing the base layer 110, a second surface 1202 opposite the first surface 1201, a third surface 1203 forming a lateral surface between the first surface 1201 and the second surface 1202. A protrusion 140 may be further provided on the second surface 1202 of the quantum dot layer 120. The second surface 1202 may be an upper surface through which light is emitted from the quantum dot layer 120. The protrusion 140 may be in direct contact with the second surface 1202, or another layer may be between the protrusion 140 and the second surface 1202. For instance, according to an example embodiment in FIG. 1, the protrusion 140 is provided on the protection layer 130. The protrusion 140 may be provided on a portion of the second surface 1202. For example, the protrusion 140 may be a metal layer. The metal layer may include silver (Ag), gold (Au), platinum (Pt), nickel (Ni), chromium (Cr) and/or aluminum (Al). The protrusion 140 may be provided in a region corresponding to an edge of the second surface 1202 such that an exit through which light is emitted from the quantum dot layer 120 may not be blocked. The protrusion 140 may guide the quantum dot layer 120 to go upward when the color conversion structure 100 is transferred to a display substrate. Owing to the protrusion 140, the roughness of an upper portion of the color conversion structure 100 may be greater than the roughness of a lower portion of the color conversion structure 100 such that when the color conversion structure 100 is transferred, the protrusion 140 may guide the quantum dot layer 120. For example, when the color conversion structure 100 is transferred for fluidic self-assembly, the quantum dot layer 120 may be positioned upward owing to the roughness difference between the upper and lower surfaces of the color conversion structure 100.

Figure 2:
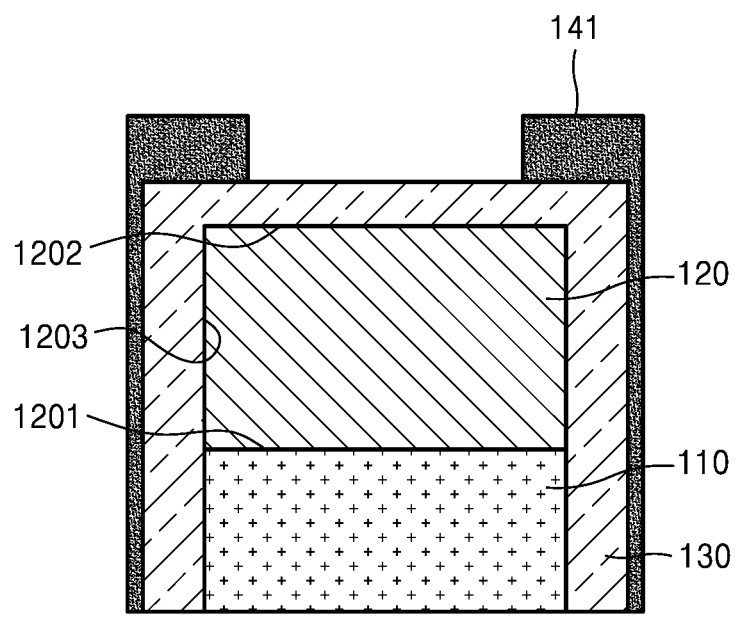
FIG. 2 is a schematic cross-sectional view illustrating a color conversion structure according to another example embodiment.

FIG. 2 is a view illustrating an example in which the protrusion 140 of the color conversion structure 100 shown in FIG. 1 is modified according to an example embodiment. In FIG. 2, substantially the same elements as those shown in FIG. 1 are denoted with the same reference numerals, and thus detailed descriptions thereof will not be presented here.

Referring to FIG. 2, a protrusion 141 may be provided in a region corresponding to the edge of the second surface 1202 and the third surface 1203 of the quantum dot layer 120. The protrusion 141 may extend to a lateral surface of the base layer 110. According to an example embodiment, the protrusion 141 may be provided to cover or surround a portion of a top surface of the quantum dot layer 120 and one or more side surfaces of the quantum dot layer 120. Moreover, the protrusion 141 may be provided to cover or surround one or more side surfaces of the base layer 110. According to an example embodiment, the protection layer 130 may be provided between the quantum dot layer 120 and the protrusion 141. Moreover, according to an example embodiment, the protection layer 130 may be provided between the base layer 110 and the protrusion 141. When the protrusion 141 is provided up to the third surface 1203 of the quantum dot layer 120, light output from the quantum dot layer 120 may not leak in a lateral direction, and thus optical efficiency may be improved. That is, because light is output from the quantum dot layer 120 only in an upward direction, the amount of effective light may increase.

Figure 3:
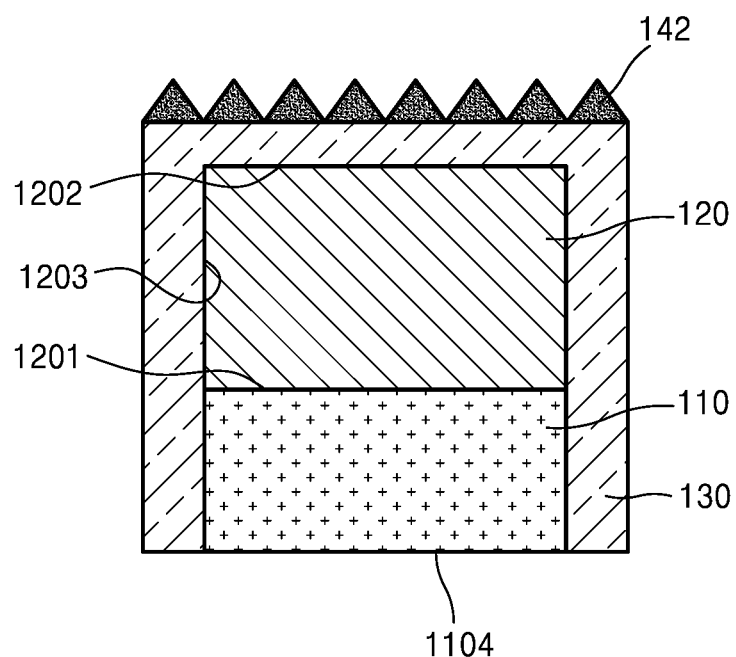
FIG. 3 is a schematic cross-sectional view illustrating a color conversion structure according to another example embodiment.

FIG. 3 is a view illustrating another example in which the protrusion 140 of the color conversion structure 100 shown in FIG. 1 is modified according to an example embodiment. In FIG. 3, substantially the same elements as those shown in FIG. 1 are denoted with the same reference numerals, and thus detailed descriptions thereof will not be presented here.

A protrusion 142 may be provided entirely in a region corresponding to the second surface 1202 of the quantum dot layer 120. The protrusion 142 may have a concave-convex pattern and may include a transparent material capable of transmitting light. According to an example embodiment, the protrusion 142 may be provided to cover or surround a top surface of the quantum dot layer 120. According to an example embodiment, the protection layer 130 may be provided between the quantum dot layer 120 and the protrusion 142.

As described above, the protrusion 142 may cause a roughness difference between the upper and lower surfaces of the color conversion structure 100 such that when the color conversion structure 100 is transferred, the quantum dot layer 120 may be positioned upward, and the base layer 110 may be positioned downward. A fourth surface 1104 of the base layer 110 which is opposite the first surface 1201 is flat without any protrusion thereon.

Figure 4:
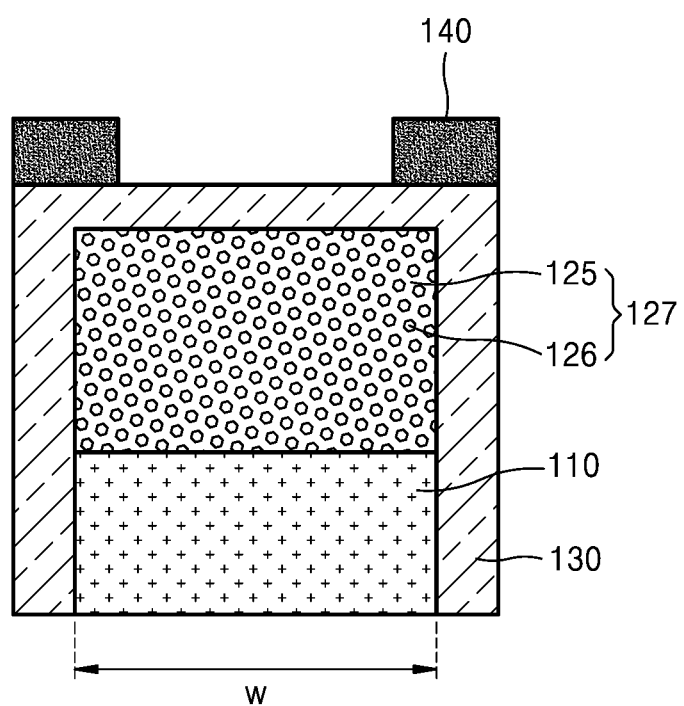
FIG. 4 is a schematic cross-sectional view illustrating a color conversion structure according to another example embodiment.

FIG. 4 is a view illustrating an example in which the quantum dot layer 120 of the color conversion structure 100 shown in FIG. 1 is modified according to an example embodiment. In FIG. 4, substantially the same elements as those shown in FIG. 1 are denoted with the same reference numerals, and thus detailed descriptions thereof will not be presented here.

A quantum dot layer 127 may have a structure in which quantum dots 126 are embedded in a porous layer 125. The porous layer 125 may include n-GaN, and the base layer 110 may include u-GaN. n-GaN may be etched by an electrochemical etching method to form the porous layer 125. The electrochemical etching method will be described later.

The quantum dots 126 may be embedded in the porous layer 125 by immersing the porous layer 125 in a liquid containing the quantum dots 126. The quantum dots 126 embedded in the porous layer 125 may increase scattering of light in the quantum dot layer 127, and thus the efficiency of color conversion may increase. When the efficiency of color conversion is high, it is possible to decrease the thickness of the quantum dot layer 127, and high-purity colors may be realized because leakage of non-converted blue light is reduced.

Figure 5:
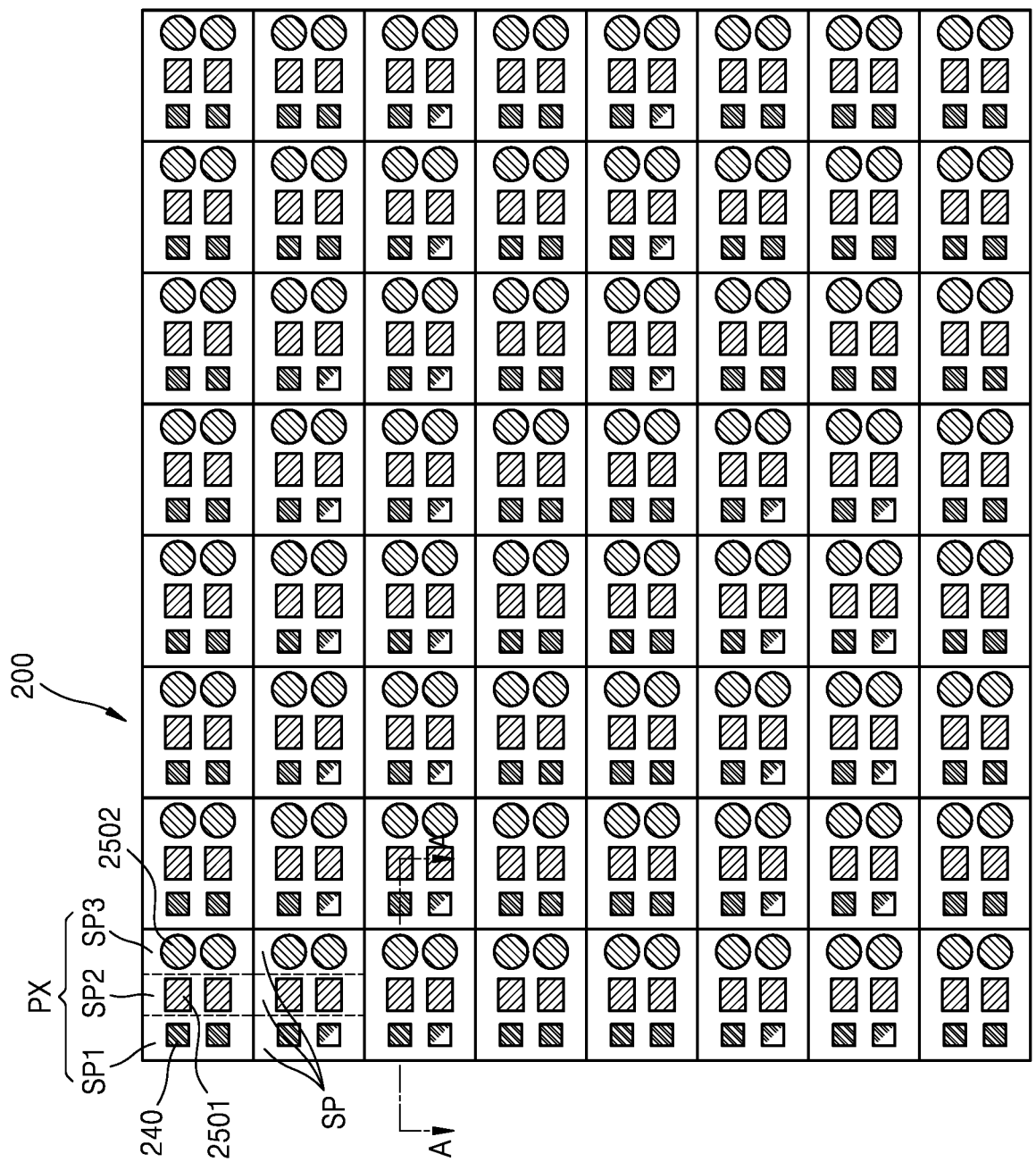
FIG. 5 is a schematic plan view illustrating a display apparatus according to an example embodiment.
Figure 6:
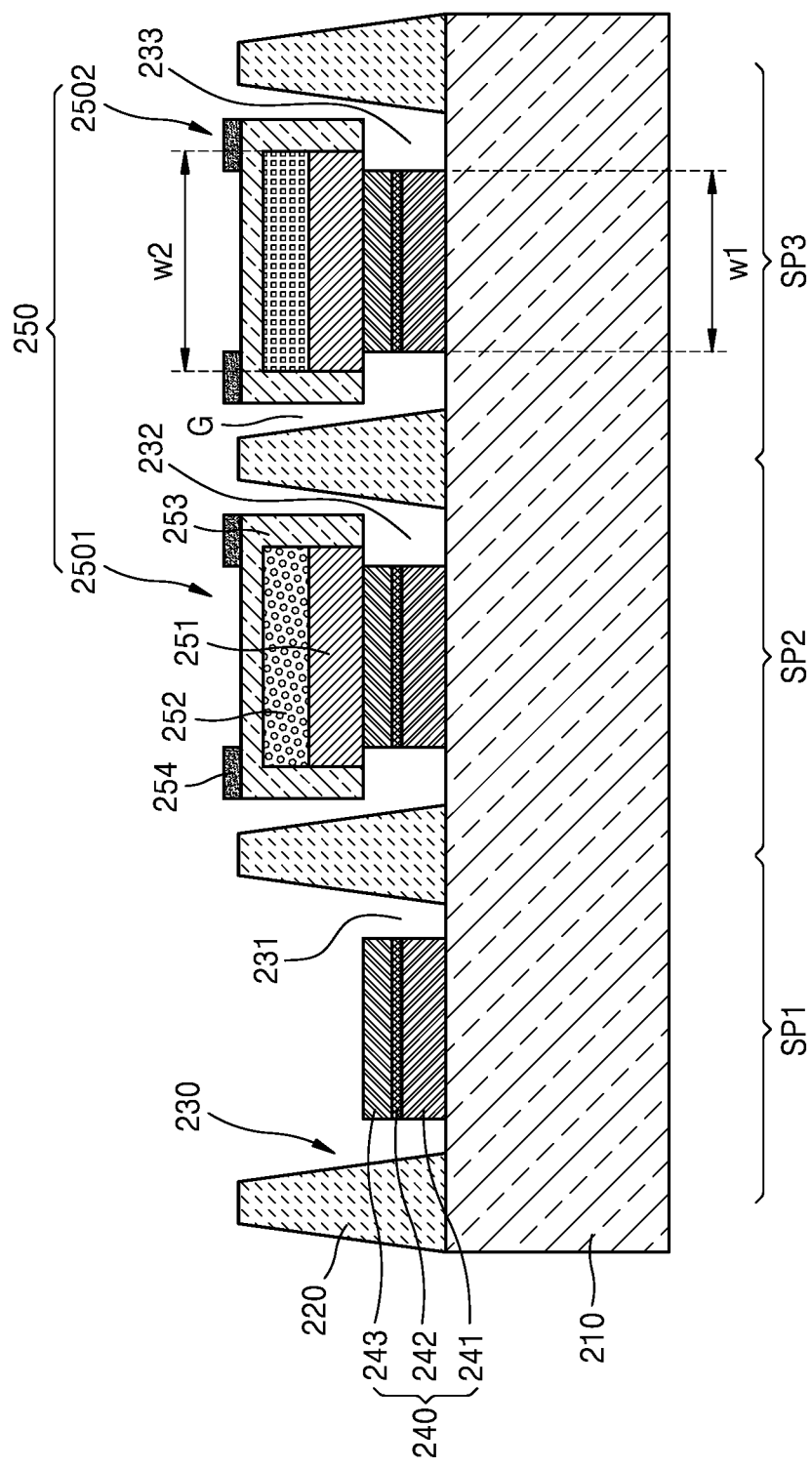
FIG. 6 is a cross-sectional view taken along line A-A of FIG. 5.

FIG. 5 is a view illustrating a display apparatus 200 according to an example embodiment, and FIG. 6 is a cross-sectional view taken along line A-A of FIG. 5.

Referring to FIG. 5, the display apparatus 200 may include a plurality of pixels PX, and each of the pixels PX may include sub-pixels SP that emit different colors. Each of the pixels PX may be one unit for displaying an image. An image may be displayed by controlling the color and amount of light from each of the sub-pixels SP. For example, each of the pixels PX may include a first sub-pixel SP1, a second sub-pixel SP2, and a third sub-pixel SP3.

Referring to FIG. 6, the display apparatus 200 may include a substrate 210, barrier ribs 220 provided on the substrate 210, micro semiconductor emitting devices 240 provided in grooves 230 defined by the barrier ribs 220, and color conversion structures 250 provided on the micro semiconductor emitting devices 240. The micro semiconductor emitting devices 240 may comprise micro light emitting diodes or organic light emitting diodes.

The grooves 230 may include, for example, a first groove 231, a second groove 232, and a third groove 233. The micro semiconductor emitting devices 240 may be respectively provided in the first groove 231, the second groove 232, and the third groove 233. For example, the micro semiconductor emitting devices 240 may emit blue light. Each of the micro semiconductor emitting devices 240 may include a first semiconductor layer 241, a light emitting layer 242, and a second semiconductor layer 243 that are sequentially stacked. The first semiconductor layer 241 may include a first-type semiconductor. For example, the first semiconductor layer 241 may include an n-type semiconductor. The first semiconductor layer 241 may include a n-type Group III-V semiconductor such as n-GaN. The first semiconductor layer 241 may have a single-layer or multi-layer structure.

The light emitting layer 242 may be provided on an upper surface of the first semiconductor layer 241. The light emitting layer 242 may emit light while electrons and holes are combined with each other in the light emitting layer 242. The light emitting layer 242 may have a multi-quantum well (MQW) or single-quantum well (SQW) structure. The light emitting layer 242 may include a Group III-V semiconductor such as GaN.

The second semiconductor layer 243 may be provided on upper surface of the light emitting layer 242. The second semiconductor layer 243 may include, for example, a p-type semiconductor. The second semiconductor layer 243 may include a p-type Group III-V semiconductor such as p-GaN. The second semiconductor layer 243 may have a single-layer or multi-layer structure. Alternatively, when the first semiconductor layer 241 includes a p-type semiconductor, the second semiconductor layer 243 may include an n-type semiconductor.

The micro semiconductor emitting devices 240 may be transferred to the substrate 210. The micro semiconductor emitting devices 240 may be transferred by a stamp method, a pick-and-place method, or a fluidic self-assembly method. When each of the micro semiconductor emitting devices 240 are etched or cut in a transferable form, the first semiconductor layer 241, the light emitting layer 242, and the second semiconductor layer 243 may have the same width w1.

The color conversion structures 250 may be substantially the same as the color conversion structure 100 described with reference to FIG. 1. The color conversion structures 250 shown in FIG. 6 have the same structure as the color conversion structure 100 described with reference to FIG. 1, but any of the color conversion structures 100 described with reference to FIGS. 2 to 4 may be employed as the color conversion structures 250.

Each of the color conversion structures 250 may include a base layer 251 and a quantum dot layer 252 provided on the base layer 251. In addition, a protection layer 253 may surround the quantum dot layer 252, and a protrusion 254 may be provided in at least a portion of an upper region of the protection layer 253.

According to an example embodiment, the color conversion structures 250 may include a first color conversion structure 2501 provided in the second sub-pixel SP2 and a second color conversion structure 2502 provided in the third sub-pixel SP3. The color conversion structures 250 may not be provided in the first sub-pixel SP1. The quantum dot layer 252 of the first color conversion structure 2501 may emit red light as being excited by blue light emitted from the micro semiconductor emitting device 240. The quantum dot layer 252 of the second color conversion structure 2502 may emit green light as being excited by blue light emitted from the micro semiconductor emitting device 240. The color band of emission may vary depending on the material or size of quantum dots in the quantum dot layers 252 of the color conversion structures 250.

The base layer 251 and the quantum dot layer 252 of each of the color conversion structures 250 may have the same width w2. The width w2 of each of the color conversion structures 250 may be greater than the width w1 of each of the micro semiconductor emitting devices 240 to increase the areas in which the color conversion structures 250 receive light emitted from the micro semiconductor emitting devices 240. In addition, when the color conversion structures 250 are transferred onto the micro semiconductor emitting devices 240, the positions of the color conversion structures 250 in the grooves 230 may be irregular. Therefore, the positions of the color conversion structures 250 relative to the micro semiconductor emitting devices 240 may be different in the sub-pixels SP. The width w2 of each of the color conversion structures 250 is greater than the width w1 of each of the micro semiconductor emitting devices 240 such that even when the transfer positions of the color conversion structure 250 vary, the areas in which light emitted from the micro semiconductor emitting devices 240 are to be received may be as wide as possible.

The color conversion structures 250 may be spaced apart from the barrier ribs 220. The color conversion structures 250 may be transferred into the grooves 230 and arranged in the grooves 230 in a state in which there are gaps G between the barrier ribs 220 and the color conversion structures 250 instead of the color conversion structures 250 being filled in the grooves 230.

Figure 7:
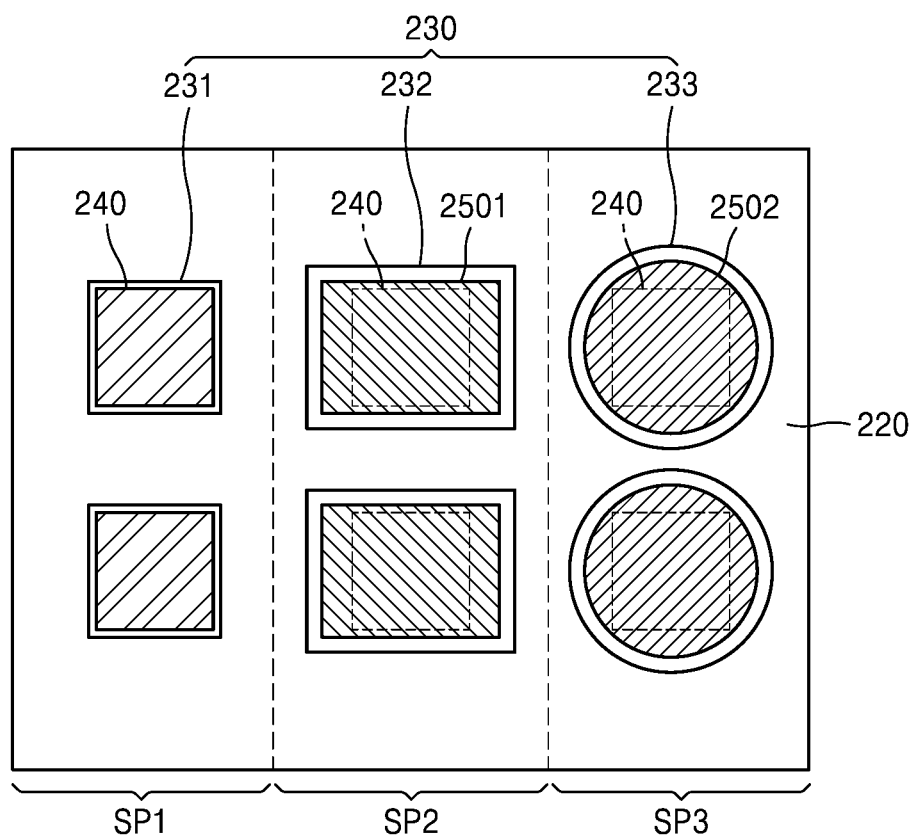
FIG. 7 is a plan view illustrating the structure shown in FIG. 6.

FIG. 7 is a plan view illustrating the structure shown in FIG. 6. FIG. 7 illustrates one pixel PX which may include a first sub-pixel SP1, a second sub-pixel SP2, and a third sub-pixel SP3.

A plurality of grooves 230 may be defined by the barrier ribs 220. The plurality of grooves 230 may include, for example, the first groove 231 provided in the first sub-pixel SP1, the second groove 232 provided in the second sub-pixel SP2, and the third groove 233 provided in the third sub-pixel SP3. One or a plurality of grooves 230 may be provided in each sub-pixel SP. In addition, the plurality of grooves 230 may have different cross-sectional shapes or sizes depending on the sub-pixels SP. The size of each of the plurality of grooves 230 may refer to the area or width of a cross-section of each of the plurality of grooves 230. For example, the first groove 231 may have a tetragonal cross-sectional shape, the second groove 232 may have a larger tetragonal cross-sectional shape than the first groove 231, and the third groove 233 may have a circular cross-sectional shape. In addition, the color conversion structures 250 may have shapes or sizes corresponding to the shapes or sizes of respective grooves 230. For example, the first color conversion structure 2501 may have a tetragonal cross-sectional shape corresponding to the second groove 232, and the second color conversion structure 2502 may have a circular cross-sectional shape corresponding to the third groove 233.

As described above, the cross-sectional shapes or sizes of the grooves 230 and the color conversion structures 250 are different according to the sub-pixels SP such that when the color conversion structures 250 are transferred into the grooves 230, the color conversion structures 250 may be positioned in desired sub-pixels SP. When the first groove 231 is smallest and the cross-sectional shapes of the second groove 232 and the third groove 233 are different from each other, the first color conversion structure 2501 and the second color conversion structure 2502 may be simultaneously transferred. For example, the cross-sectional shape of the first groove 231 is not limited as long as the first groove 231 has a size which does not allow the first color conversion structure 2501 and the second color conversion structure 2502 to enter the first groove 231. In addition, the second groove 232 may have a size or cross-sectional shape not allowing the second color conversion structure 2502 to enter the second groove 232, and the third groove 233 may have a size or a cross-sectional shape not allowing the first color conversion structure 2501 to enter the third groove 233.

Alternatively, the grooves 230 may have the same shape but the sizes of the grooves 230 may be different from each other. For example, the first groove 231, the second groove 232, and the third groove 233 may each have a tetragonal cross-sectional shape with a relationship of the width (or size) of the first groove 231 less than (<) the width (or size) of the second groove 232 less than (<) the width (or size) of the third groove 233 and a relationship of the width (or size) of the first color conversion structure 2501 less than (<) the width (or size) of the second color conversion structure 2502. In this case, the first color conversion structure 2501 and the second color conversion structure 2502 may be sequentially transferred. The second color conversion structure 2502 having the largest size may be first transferred to the third groove 233, and then the first color conversion structure 2501 may be transferred to the second groove 232.

The shapes and sizes of the first groove 231, the second groove 232, the third groove 233, the first color conversion structure 2501, and the second color conversion structure 2502 are appropriately selected such that the first color conversion structure 2501 and the second color conversion structure 2502 may be simultaneously or sequentially transferred into the grooves 230 corresponding thereto. However, the disclosure is not limited to the sizes and shapes illustrated in FIG. 7.

In addition, although the number of grooves in each sub-pixel SP may vary, FIG. 7 shows an example in which two grooves are provided in each sub-pixel SP.

Figure 8:
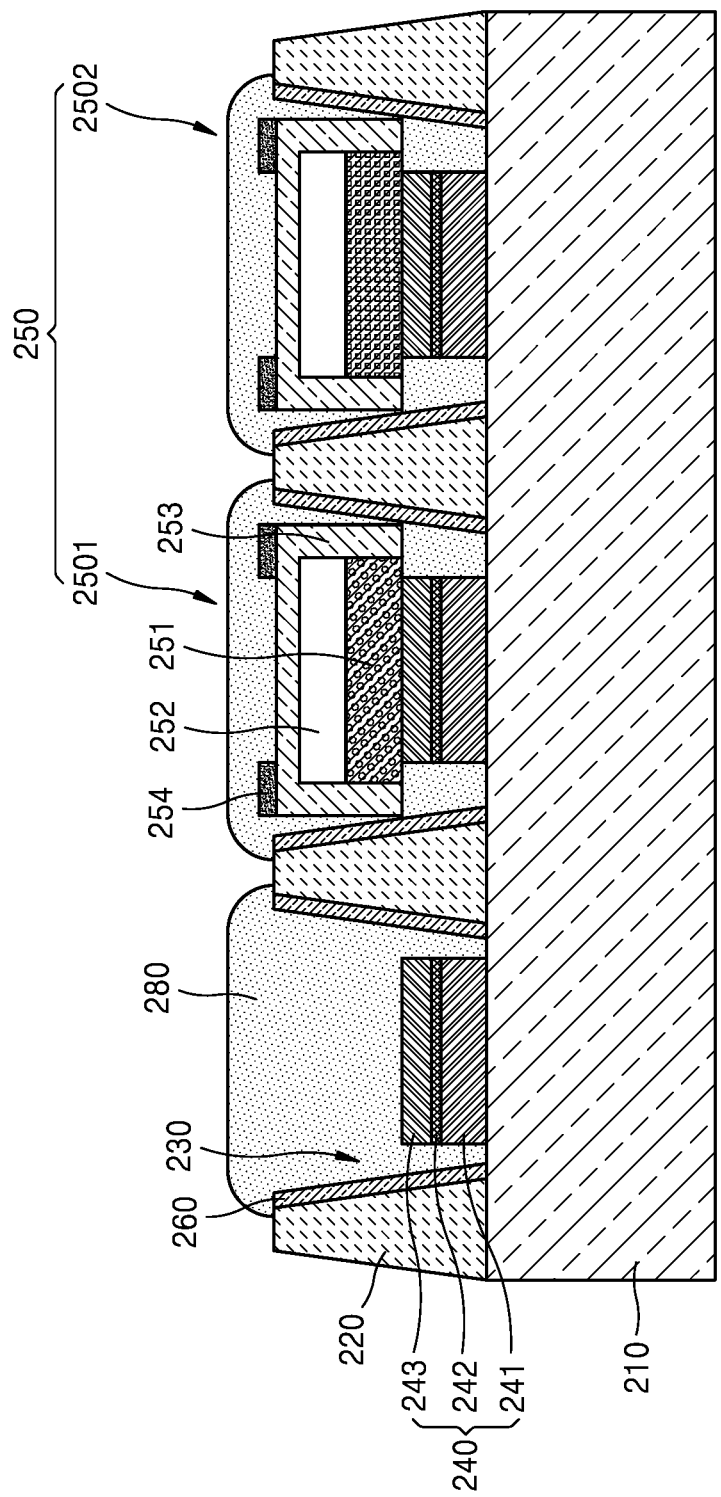
FIG. 8 is a view illustrating an example in which the display apparatus shown in FIG. 6 further includes a cap layer and a reflection layer.

FIG. 8 is a view illustrating an example in which a cap layer 280 and a reflection layer 260 are further provided in the display apparatus 200 shown in FIG. 6 according to an example embodiment.

In FIG. 8, substantially the same elements as those shown in FIG. 6 are denoted with the same reference numerals, and thus detailed descriptions thereof will not be presented here. The reflection layer 260 may be further provided on the barrier ribs 220 in each of the grooves 230. The reflection layer 260 may provide effective light by reflecting light emitted from the micro semiconductor emitting devices 240. The micro semiconductor emitting devices 240 may be respectively arranged in the grooves 230; and the first groove 231, the second groove 232, and the third groove 233 may be covered by the cap layer 280. The cap layer 280 may include a transparent material capable of transmitting light.

The cap layer 280 may protect and fix the first color conversion structure 2501 and the second color conversion structure 2502.

A method of manufacturing color conversion structures will be described according to an example embodiment with reference to FIGS. 9 to 14.

Figure 9:
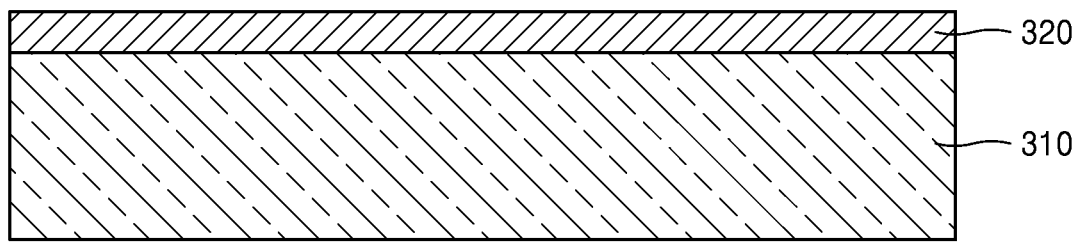
FIGS. 9 to 14 are views illustrating a method of manufacturing color conversion structures according to an example embodiment.
Figure 10:
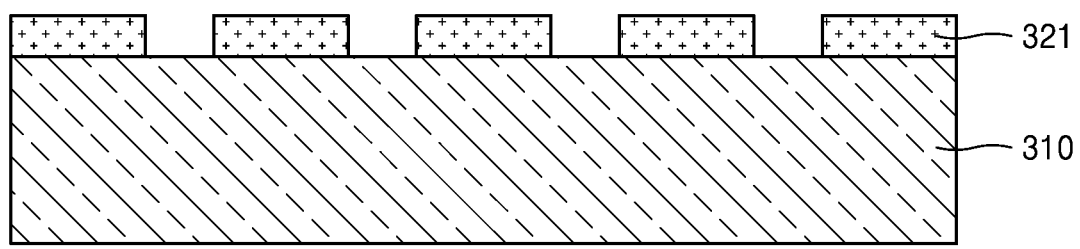
Figure 11:
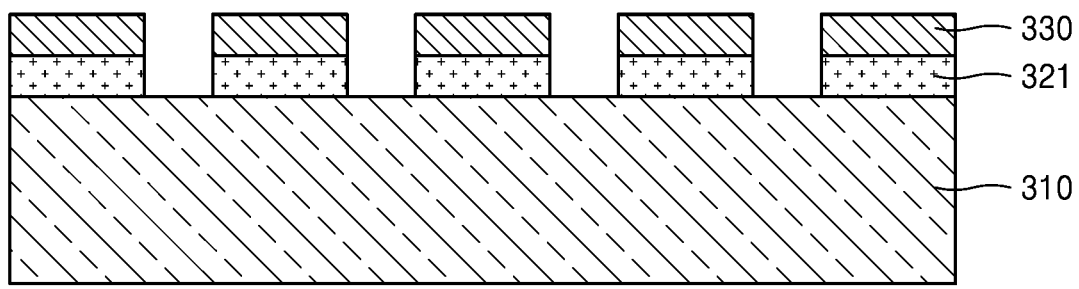
Figure 12:
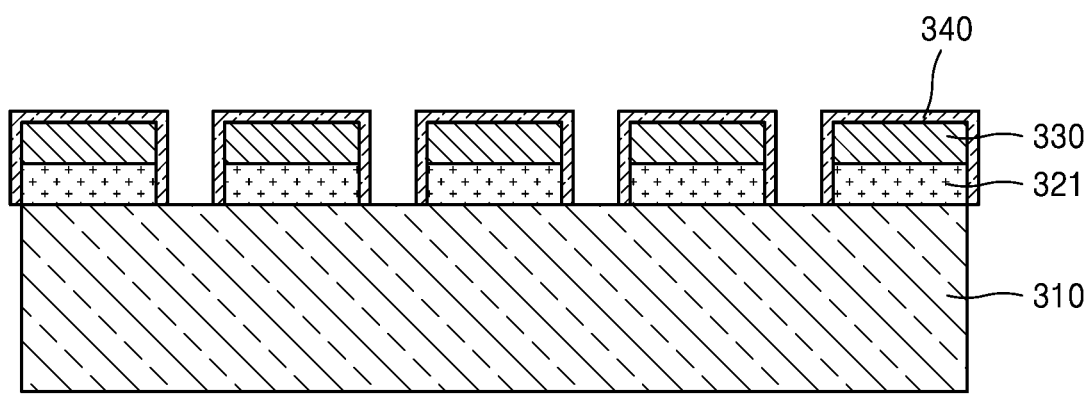
Figure 13:
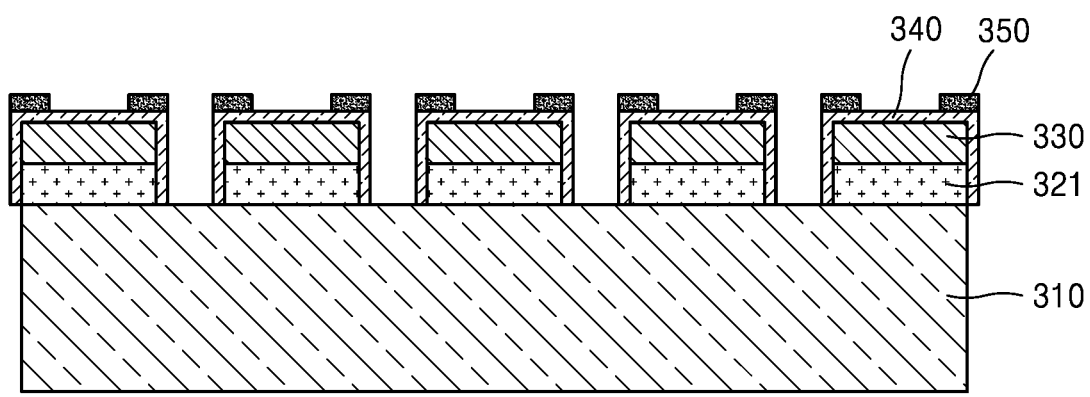

Referring to FIG. 9, a first layer 320 may be formed on a first substrate 310. Referring to FIG. 10, base layers 321 may be formed by patterning and etching the first layer 320. Referring to FIG. 11, quantum dot layers 330 may be formed on the base layers 321. Referring to FIG. 12, protection layers 340 may be formed such that the protection layers 340 may surround the quantum dot layers 330. The protection layers 340 may surround the quantum dot layers 330 and the base layers 321 as well. Referring to FIG. 13, protrusions 350 may be formed in upper edge regions of the protection layers 340. According to an example embodiment, a layer for forming the protrusions 350 may be formed on the protection layers 340, and then an exposing and etching process may be performed on the layer to form the protrusions 350 in the upper edge regions of the protection layers 340. The protrusions 350 may include a metal. Light emitted from the quantum dot layers 330 may be output through regions in which the protrusions 350 are not formed. Thereafter, referring to FIG. 14, color conversion structures 360, which are discretely arranged on the first substrate 310, may be separated from each other by removing the first substrate 310 using a solution. The color conversion structures 360 may have a film structure having a width of, for example, about 300 μm or less.

Figure 15:
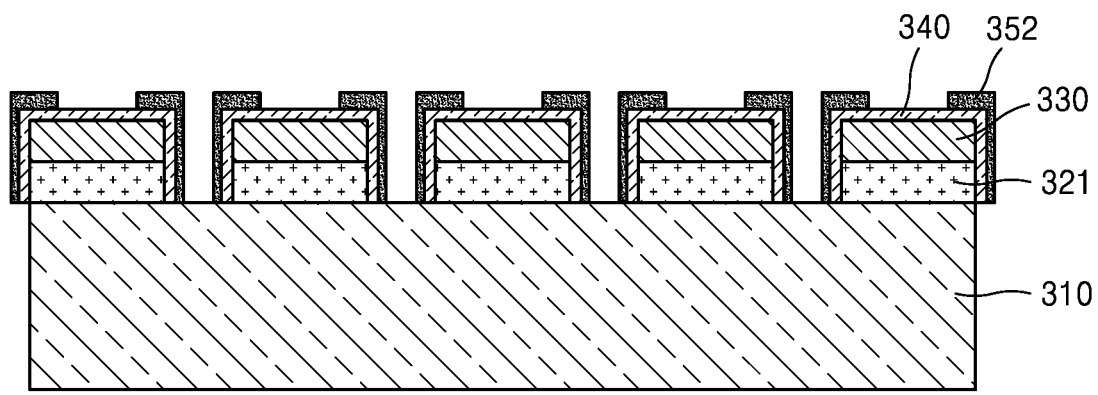
FIGS. 15 and 16 are views illustrating a method of manufacturing color conversion structures according to another example embodiment.
Figure 16:
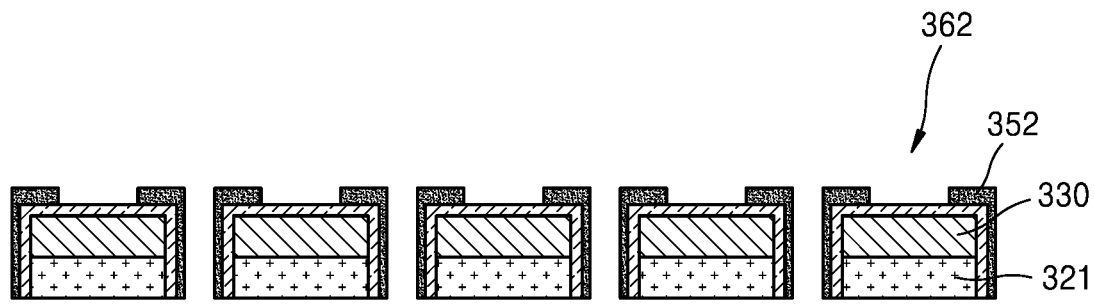

FIGS. 15 and 16 are views illustrating a method of forming modified protrusions after the operation shown in FIG. 12 according to another example embodiment. Referring to FIG. 15, protrusions 352 may be formed in such a manner that the protrusions 352 may extend not only on the upper edge portions of the protection layers 340, but also on lateral surfaces of the protection layers 340. Thereafter, referring to FIG. 16, transferable color conversion structures 362 may be formed by removing the first substrate 310.

Figure 17:
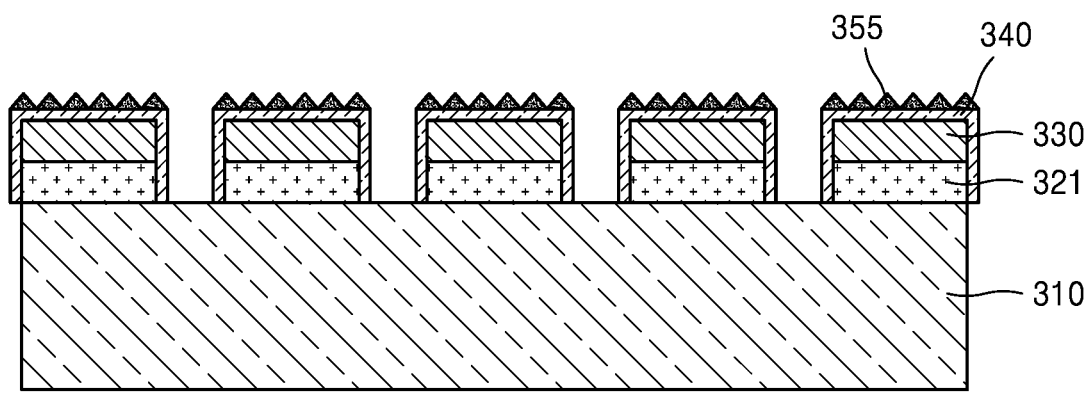
FIGS. 17 and 18 are views illustrating a method of manufacturing color conversion structures according to another example embodiment.
Figure 18:
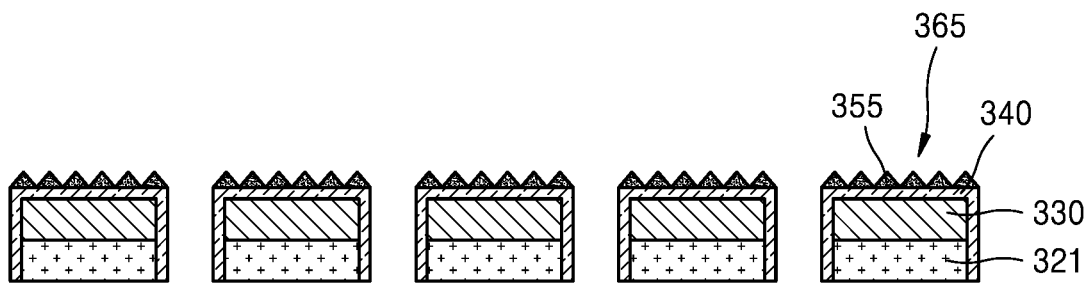

FIGS. 17 and 18 are views illustrating a method of forming modified protrusions after the operation shown in FIG. 12 according to another example embodiment. Referring to FIG. 17, another layer may be formed on top of the protection layers 340, and concave-convex patterns 355 may be formed on the other layer. According to an example embodiment, the other layer may be patterned to form the concave-convex patterns 355. The concave-convex patterns 355 may be formed on the upper surfaces of the protection layers 340 and may include a transparent material such that light emitted from the quantum dot layers 330 may be output through the concave-convex patterns 355. The example embodiment shows an example in which the concave-convex patterns 355 are formed as protrusions. Referring to FIG. 18, transferable color conversion structures 365 may be formed by removing the first substrate 310.

Figure 14:
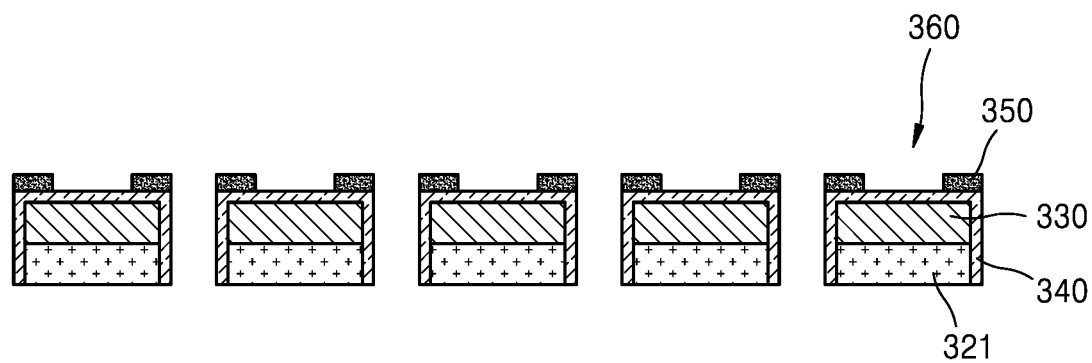

When the color conversion structures 360, 362, or 365 are transferred to a display substrate (described later), the protrusions 350 shown in FIG. 14, the protrusions 352 shown in FIG. 16, or the concavo-convex patterns 355 shown in FIG. 18 may guide the color conversion structures 360, 362, or 365 such that the upper and lower sides of the color conversion structures 360, 362, or 365 may be maintained. When the color conversion structures 360, 362, or 365 are transferred to a display substrate by a fluidic self-assembly method, the upper and lower sides of the color conversion structures 360, 362, or 365 may not be reversed because the protrusions 350, the protrusions 362, or the concave-convex patterns 355 interact with a fluid.

FIGS. 19 to 24 are views illustrating a method of manufacturing color conversion structures according to another example embodiment.

Figure 19:
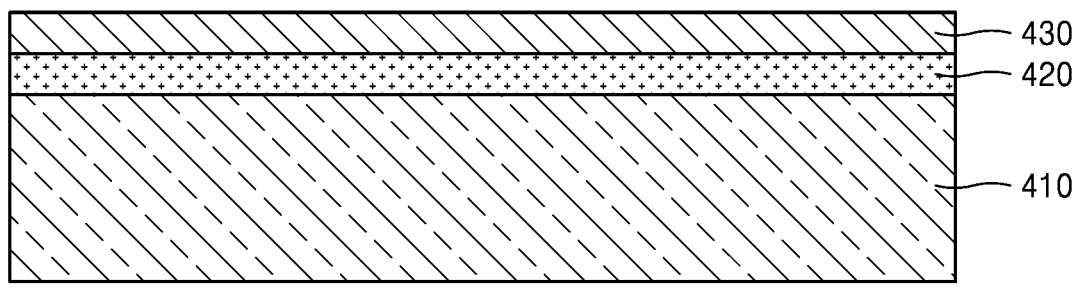
FIGS. 19 to 24 are views illustrating a method of manufacturing color conversion structures according to another example embodiment.
Figure 20:
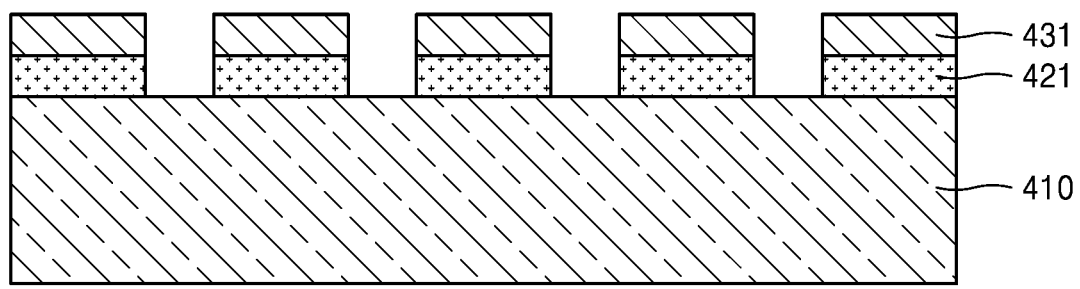

Referring to FIG. 19, a first layer 420 and a second layer 430 are grown on a substrate 410. The substrate 410 may be, for example, a sapphire substrate or a silicon substrate. The first layer 420 may include n-GaN, and the second layer 430 may include n-GaN. n-GaN may include, for example, a silicon dopant. Referring to FIG. 20, base layers 421 and porous layers 431 may be formed by etching the first layer 420 and the second layer 430 by an electrochemical etching method.

When the first layer 420 and the second layer 430 are electrochemically etched, only the second layer 430 including an n-type dopant may be selectively formed as the porous layers 431, and the first layer 420 may be etched with no change as the base layers 421. According to the electrochemical etching method, etching may be performed by immersing a sample to be etched in a specific solvent, connecting electrodes to the sample and the solvent, and generating carriers by an external bias voltage. In this case, various solvents such as an oxalic acid may be used as the solvent. In the electrochemical etching method, an electrode may be directly connected to the sample or may be indirectly connected to the sample by using two chambers.

When a voltage is applied to the sample, the sample may be selectively etched under specific conditions, and thus the sample may be transformed into a porous layer. For example, an etchant including at least one selected from the group consisting of KOH, NaOH, HCl, $C_2H_2O_4$, $H_2SO_4$, $HNO_3$, and HF may be used.

Figure 21:
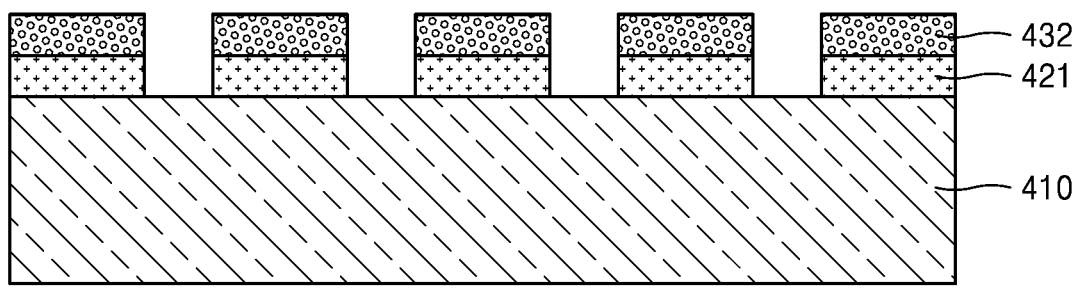
Figure 22:
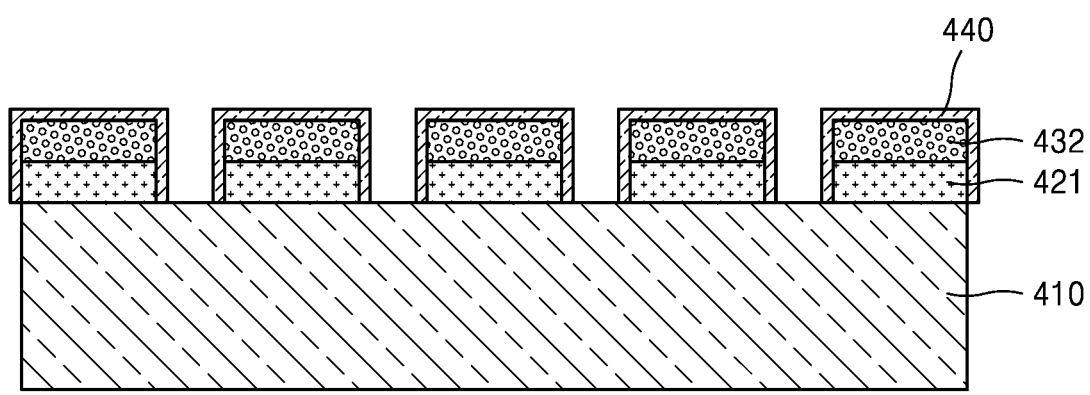

Referring to FIG. 21, quantum dot layers 432 in which quantum dots are filled in a porous structure may be formed by immersing the porous layers 431 in a liquid containing quantum dots. Referring to FIG. 22, protection layers 440 may be deposited such that the protection layers 440 may surround the base layers 421 and the quantum dot layers 432. The protection layers 440 may protect the quantum dot layers 432 such that the performance of the quantum dot layer 432 may not decrease under the influence of an external environment. The protection layers 440 may include, for example, $Al_2O_3$, $SiO_2$, or SiN.

Figure 23:
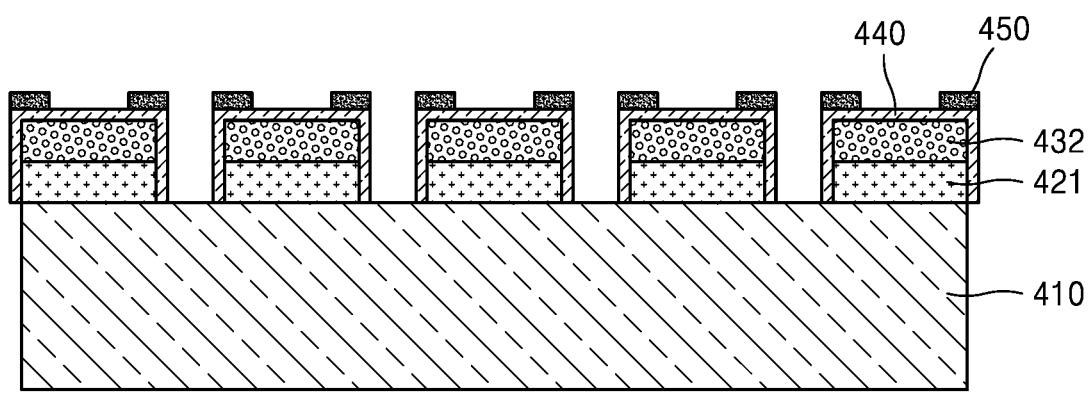

Referring to FIG. 23, protrusions 450 may be formed on the protection layers 440. The protrusions 450 may be provided on at least portions of surfaces of the protection layers 440 corresponding to upper surfaces of the quantum dot layers 432. The upper surfaces of the quantum dot layers 432 may be surfaces through which light is output. The protrusions 450 may be provided in edge regions of the upper surfaces of the quantum dot layers 432 except for regions through which light is to be output. In this case, the protrusions 450 may include a metal layer. The metal layer may include, for example, silver (Ag), gold (Au), platinum (Pt), nickel (Ni), chromium (Cr), and/or aluminum (Al). Alternatively, the protrusions 450 may be concave-convex patterns formed on the upper surfaces of the quantum dot layers 432. When the protrusions 450 are formed as concave-convex patterns, the protrusions 450 may include a light-transmitting material.

Figure 24:
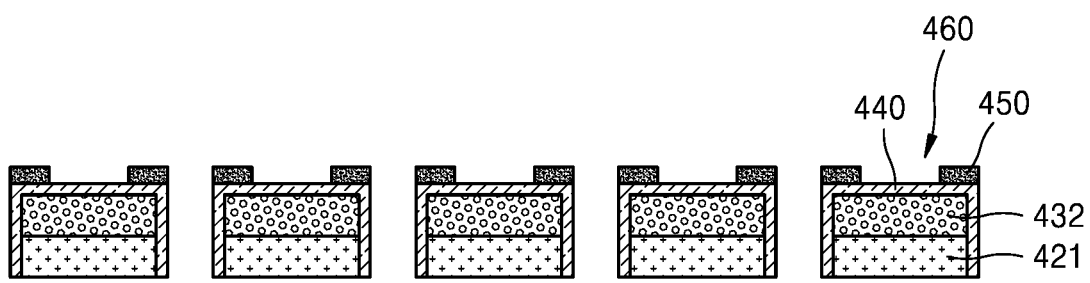

Referring to FIG. 24, color conversion structures 460, which are independently separate from each other, may be formed by removing the substrate 410 from the base layers 421.

A method of manufacturing a display apparatus according to an example embodiment will be described with reference to FIGS. 25 to 27.

Figure 25:
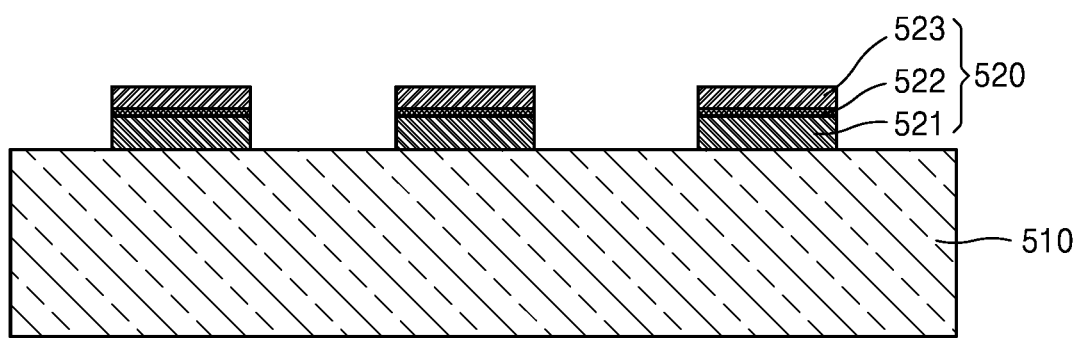
FIGS. 25 to 27 are views illustrating a method of manufacturing a display apparatus according to an example embodiment.

Referring to FIG. 25, micro semiconductor emitting devices 520 may be arranged on a display substrate 510. The display substrate 510 may be a backplane substrate including a driver for driving the micro semiconductor emitting devices 520, or a transfer mold substrate for transferring the micro semiconductor emitting devices 520. Each of the micro semiconductor emitting devices 520 may include a first semiconductor layer 521, a light emitting layer 522, and a second semiconductor layer 523. The micro semiconductor emitting devices 520 may be arranged on the display substrate 510 by a transfer method. As the transfer method, a pick-and-place method or a fluidic self-assembly method may be used. For example, the micro semiconductor emitting devices 520 may have a width of about 200 µm or less. The micro semiconductor emitting devices 520 may be spaced apart from each other on a sub-pixel basis. Alternatively, a plurality of micro semiconductor emitting devices may be arranged in each sub-pixel region.

Figure 26:
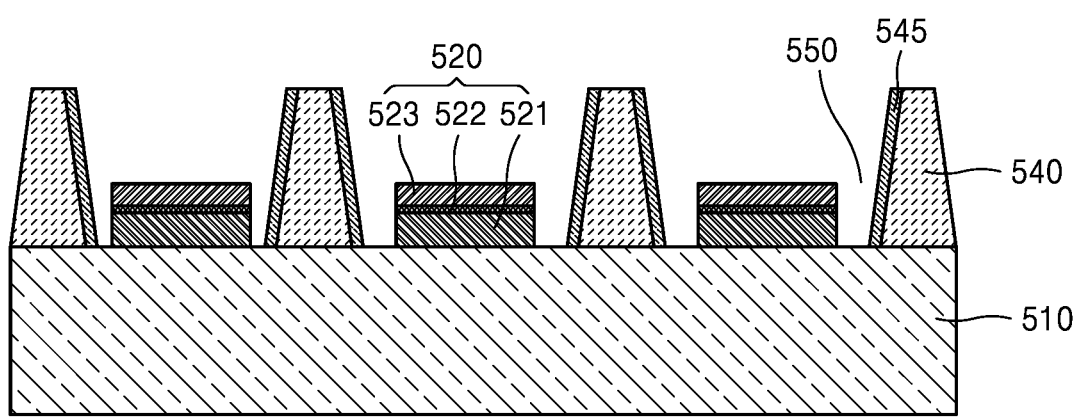

Referring to FIG. 26, barrier ribs 540 may be formed on the display substrate 510 to define one or more grooves 550 on a sub-pixel basis. The barrier ribs 540 may be formed by forming a layer which covers the micro semiconductor emitting devices 520, and then etching the layer. A reflection layer 545 may be further formed on inner sides of the barrier ribs 540. A metal layer may be formed as the reflection layer 545.

Figure 27:
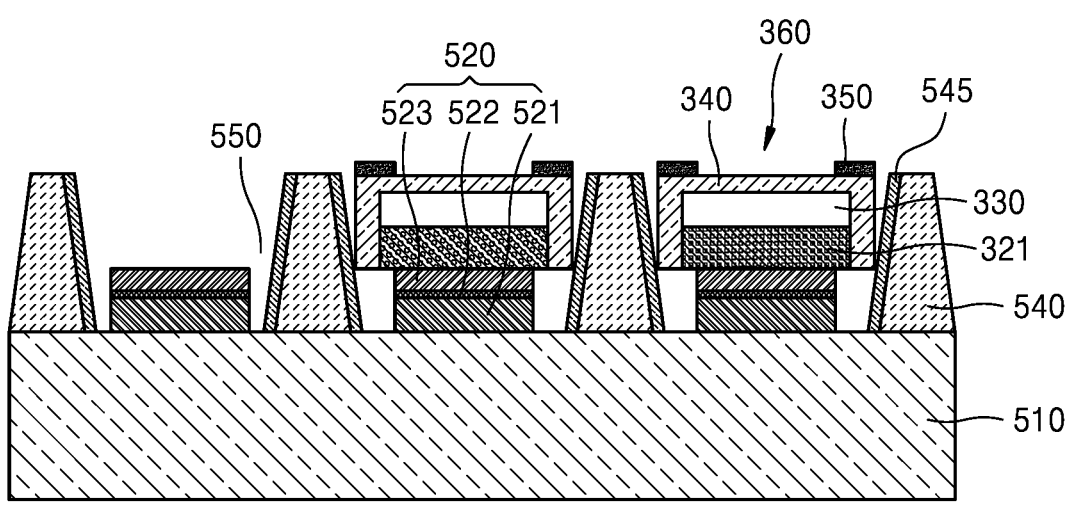

Referring to FIG. 27, the color conversion structures 360 described above may be arranged on the micro semiconductor emitting devices 520. Although the color conversion structures 360 are illustrated in FIG. 27 by way of example, it is also possible to use the color conversion structures 362, 365, or 460 described above. The color conversion structures 360 may be arranged in the grooves 550 by a transfer method. As the transfer method, a pick-and-place method or a fluidic self-assembly method may be used.

Figure 28:
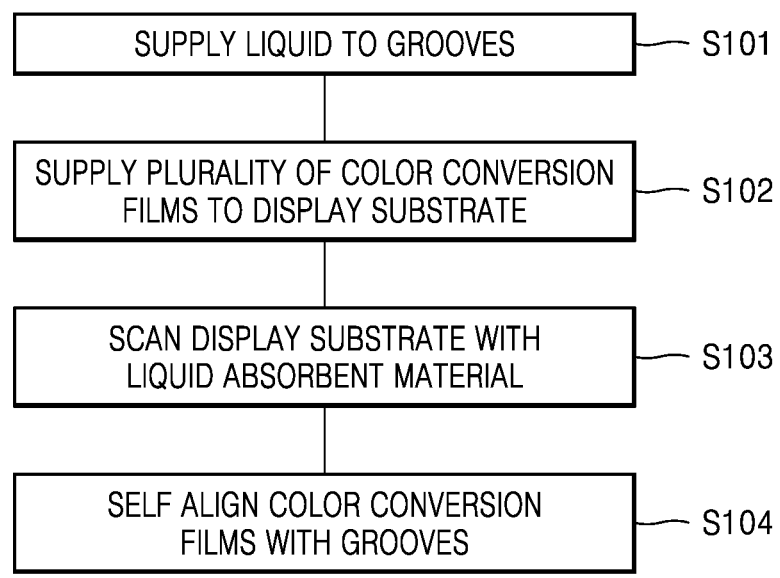
FIG. 28 is a view illustrating a method for fluidic self-assembly of color conversion structures when manufacturing a display apparatus, according to an example embodiment.

A method of transferring the color conversion structures 360 by fluidic self-assembly according to an example embodiment will now be described. Referring to FIG. 28, a liquid may be supplied to the grooves 550 to transfer the color conversion structures 360 into the grooves 550 (S101). Any type of liquid may be used as the liquid as long as the liquid does not corrode or damage the color conversion structures 360. The liquid may include, for example, one or a combination selected from the group consisting of water, ethanol, alcohols, polyols, ketones, halocarbons, acetone, fluxes, and organic solvents. The organic solvents may include, for example, isopropyl alcohol (IPA). The liquid is not limited thereto, and other types of liquids may be used.

For example, as a method of supplying the liquid to the grooves 550, various methods such as a spray method, a dispensing method, an inkjet dot method, and a method of allowing the liquid to flow on the display substrate 510 may be used. The supply amount of the liquid may be variously adjusted such that the liquid may fit or overflow the grooves 550.

The color conversion structures 360 may be supplied to the display substrate 510 (S102). The color conversion structures 360 may be directly scattered on the display substrate 510 without using any other liquid or may be supplied to the display substrate 510 in a state in which the color conversion structures 360 are contained in a suspension. As a method of supplying the color conversion structures 520 contained in a suspension, a spray method, a dispensing method of dripping a liquid, an inkjet dot method of ejecting a liquid like a printing method, a method of allowing a suspension to flow on the display substrate 510, or the like may be used. Thereafter, the display substrate 510 may be scanned with an absorbent material capable of absorbing the liquid (S103). The absorbent material may suffice as long as the absorbent material is capable of absorbing liquid, and the shape or structure of the absorbent material are not limited. Examples of the absorbent material may include fabrics, tissue, polyester fiber, paper, wipers, and the like.

The display substrate 510 may be scanned with the absorbent material while appropriately pressing the display substrate 510 with the absorbent material. The scanning may include an action in which the absorbent material absorbs the liquid while passing by the grooves 550 in contact with the display substrate 510. The scanning may be performed by various methods such as a method of sliding the absorbent material, a method of rotating the absorbent material, a method of translating the absorbent material, a method of reciprocating the absorbent material, a method of rolling the absorbent material, a method of spinning the absorbent material, and/or a rubbing method with the absorbent material, and these methods may be performed in a regular or irregular manner. The scanning may be performed by moving the display substrate 510 instead of moving the absorbent material, and in this case, such a method as a sliding method, a rotating method, a translating method, a reciprocating method, a rolling method, a spinning method, and/or a rubbing method may be used. In addition, the scanning may be performed by moving both the absorbent material and the display substrate 510. In this manner, the color conversion structures 360 may be aligned with the grooves 550 of the display substrate 510 by a fluidic self-assembly method (S104).

When the color conversion structures 360 are aligned with the grooves 550, the upper and lower sides of the color conversion structures 360 may be distinguishingly oriented. The protrusions 350 are on the upper portions of the color conversion structures 360, and the lower surfaces of the base layers 321 formed on the lower sides of the color conversion structures 360 are flat, such that the upper and lower sides of the color conversion structures 360 may have different degrees of roughness and may thus have different surface energy levels. Therefore, the upper and lower sides of the color conversion structure 360 may be guided when the display substrate 510 is scanned while the absorbent material absorbs the liquid. During the scanning with the absorbent material, the color conversion structures 360 may be guided such that surfaces of the color conversion structures 360 having a relatively high roughness value may face upward according to the flow of the liquid, and surfaces of the color conversion structures 360 having a relatively low roughness value may face downward according to the flow of the liquid.

Figure 29:
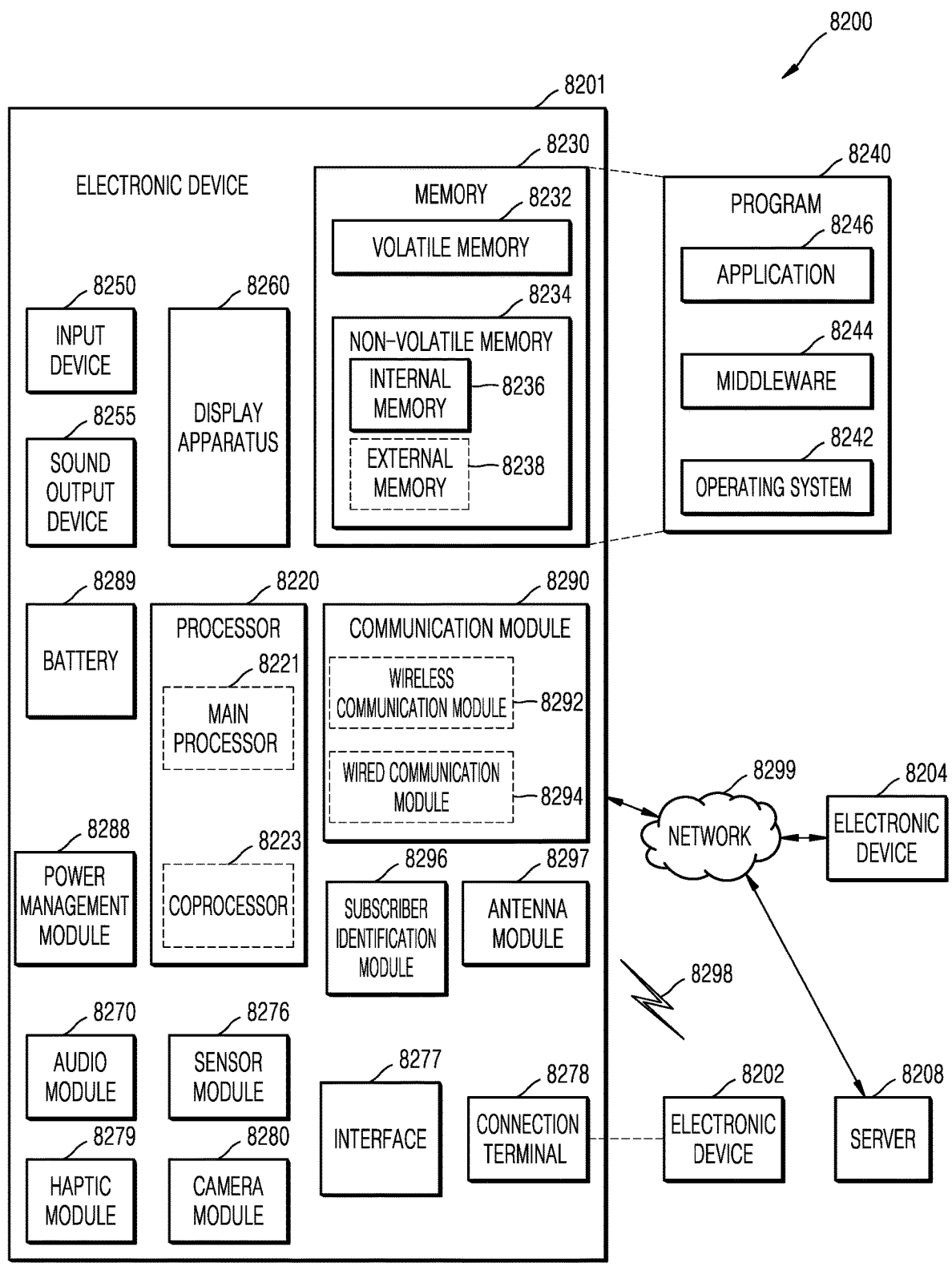
FIG. 29 is a schematic block diagram illustrating an electronic device according to an example embodiment.

FIG. 29 is a block diagram illustrating an electronic device 8201 including a display apparatus 8260 according to an example embodiment.

Referring to FIG. 29, the electronic device 8201 may be provided in a network environment 8200. In the network environment 8200, the electronic device 8201 may communicate with another electronic device 8202 through a first network 8298 (such as a short-range wireless communication network) or may communicate with another electronic device 8204 and/or a server 8208 through a second network 8299 (such as a long-range wireless communication network). The electronic device 8201 may communicate with the electronic device 8204 through the server 8208. The electronic device 8201 may include a processor 8220, a memory 8230, an input device 8250, a sound output device 8255, the display apparatus 8260, an audio module 8270, a sensor module 8276, an interface 8277, a haptic module 8279, a camera module 8280, a power management module 8288, a battery 8289, a communication module 8290, a subscriber identification module 8296, and/or an antenna module 8297. Some of the components of the electronic device 8201 may be omitted, or other components may be added to the electronic device 8201. Some of the components may be implemented as one integrated circuit. For example, the sensor module 8276 (such as a fingerprint sensor, an iris sensor, or an illuminance sensor) may be embedded in the display apparatus 8260 (such as a display).

The processor 8220 may execute software (such as a program 8240) to control one or more other components (such as hardware or software components) of the electronic device 8201 which are connected to the processor 8220, and the processor 8220 may perform various data processing or operations. As part of data processing or computation, the processor 8220 may load commands and/or data received from other components (such as the sensor module 8276, the communication module 8290, etc.) on a volatile memory 8232, process the commands and/or data stored in the volatile memory 8232, and store resulting data in a non-volatile memory 8234. The non-volatile memory 8234 may include an internal memory 8236 and an external memory 8238. The processor 8220 may include: a main processor 8221 (such as a central processing unit, an application processor, etc.); and a coprocessor 8223 (such as a graphics processing unit, an image signal processor, a sensor hub processor, a communication processor, etc.) that may be operated independently or in conjunction with the main processor 8221. The coprocessor 8223 may consume less power than the main processor 8221 and may perform a specialized function.

The coprocessor 8223 may control functions and/or states related to some of the components (such as the display apparatus 8260, the sensor module 8276, and the communication module 8290) of the electronic device 8201, instead of the main processor 8221 while the main processor 8221 is in an inactive state (sleep mode) or together with the main processor 8221 while the main processor 8221 is in an active state (application-execution mode). The coprocessor 8223 (such as an image signal processor, a communication processor, etc.) may be implemented as part of a functionally related component (such as the camera module 8280 or the communication module 8290).

The memory 8230 may store various pieces of data required by the components (such as the processor 8220, the sensor module 8276, etc.) of the electronic device 8201. For example, the data may include: software (such as the program 8240); and instruction input data and/or output data which are related to the software. The memory 8230 may include the volatile memory 8232 and/or the non-volatile memory 8234.

The program 8240 may be stored as software in the memory 8230 and may include an operating system 8242, middleware 8244, and/or an application 8246.

The input device 8250 may receive, from outside the electronic device 8201 (for example, a user), commands and/or data to be used in the components (such as the processor 8220) of the electronic device 8201. The input device 8250 may include a remote controller, a microphone, a mouse, a keyboard, and/or a digital pen (such as a stylus pen).

The sound output device 8255 may output a sound signal to the outside of the electronic device 8201. The sound output device 8255 may include a speaker and/or a receiver. The speaker may be used for general purposes such as multimedia playback or recorded data playback, and the receiver may be used to receive incoming calls. The receiver may be integrated as a part of the speaker or may be implemented as an independent separate device.

The display apparatus 8260 may provide information to the outside of the electronic device 8201 in a visual manner. The display apparatus 8260 may include a device such as a display, a hologram device, or a projector, and a control circuit for controlling the device. The display apparatus 8260 may include the display apparatus 200 described with reference to FIGS. 5 to 8, and may be manufactured by the manufacturing method described with reference to FIGS. 25 to 27. The display apparatus 8260 may include: touch circuitry configured to detect touches; and/or a sensor circuit (such as a pressure sensor) configured to measure the magnitudes of forces generated by touches.

The audio module 8270 may convert a sound into an electric signal or may conversely convert an electric signal into a sound. The audio module 8270 may acquire a sound through the input device 8250, or may output a sound through the sound output device 8255 and/or the speaker and/or headphone of another electronic device (such as the electronic device 8202) which are directly or wirelessly connected to the electronic device 8201.

The sensor module 8276 may detect an operating state (such as the power or the temperature) of the electronic device 8201 or an external environmental state (such as a user state) and may generate an electrical signal and/or a data value corresponding to the detected state. The sensor module 8276 may include a gesture sensor, a gyro sensor, a barometric pressure sensor, a magnetic sensor, an accelerometer sensor, a grip sensor, a proximity sensor, a color sensor, an infrared (IR) sensor, a biometric sensor, a temperature sensor, a humidity sensor, and/or an illumination sensor.

The interface 8277 may support one or more designated protocols that may be used by the electronic device 8201 for directly or wirelessly connection with another electronic device (such as the electronic device 8202). The interface 8277 may include a high-definition multimedia Interface (HDMI), a universal serial bus (USB) interface, a secure digital (SD) card interface, and/or an audio interface.

A connection terminal 8278 may include a connector through which the electronic device 8201 may be physically connected to another electronic device (such as the electronic device 8202). The connection terminal 8278 may include an HDMI connector, an USB connector, an SD card connector, and/or an audio connector (such as a headphone connector).

The haptic module 8279 may convert an electrical signal into a mechanical stimulus (such as vibration, movement, etc.) or an electrical stimulus that a user may perceive by the tactile or kinesthetic sense. The haptic module 8279 may include a motor, a piezoelectric element, and/or an electrical stimulation device.

The camera module 8280 may capture still images and moving images. The camera module 8280 may include a lens assembly including one or more lenses, image sensors, image signal processors, and/or flashes. The lens assembly of the camera module 8280 may collect light coming from a subject to be imaged.

The power management module 8288 may manage power supplied to the electronic device 8201. The power management module 8288 may be implemented as part of a power management integrated circuit (PMIC).

The battery 8289 may supply power to the components of the electronic device 8201. The battery 8289 may include non-rechargeable primary cells, rechargeable secondary cells, and/or fuel cells.

The communication module 8290 may support the establishment of a direct (wired) communication channel and/or a wireless communication channel between the electronic device 8201 and another electronic device (such as the electronic device 8202, the electronic device 8204, or the server 8208), and may support communication through the established communication channel. The communication module 8290 may include one or more communication processors that operate independently of the processor 8220 (such as an application processor) and support direct communication and/or wireless communication. The communication module 8290 may include: a wireless communication module 8292 (such as a cellular communication module, a short-range wireless communication module, or a global navigation satellite system (GNSS) communication module); and/or a wired communication module 8294 (such as a local area network (LAN) communication module or a power line communication module). The communication modules 8292 and 8294 may communicate with another electronic device through the first network 8298 (for example, a short-range communication network such as Bluetooth, WiFi direct, or infrared data association (IrDA)), or the second network 8299 (for example, a long-range communication network such as a cellular network, the Internet, or a computer network (LAN, WAN, etc.)). Such various types of communication modules may be integrated into one component (single chip, etc.) or may be implemented as a plurality of components (plural chips) separate from each other. The wireless communication module 8292 may identify and authenticate the electronic device 8201 in a communication network such as the first network 8298 and/or the second network 8299 by using subscriber information (such as an international mobile subscriber identifier (IMSI)) stored in the subscriber identification module 8296.

The antenna module 8297 may transmit or receive signals and/or power to or from the outside (for example, other electronic devices). An antenna may include a radiator which has a conductive pattern formed on a substrate (such as a PCB). The antenna module 8297 may include one or a plurality of such antennas. When the antenna module 8297 include a plurality of antennas, the communication module 8290 may select one of the plurality of antennas which is suitable for a communication method used in a communication network such as the first network 8298 and/or the second network 8299. Signals and/or power may be transmitted between the communication module 8290 and another electronic device through the selected antenna. In addition to the antennas, other components (such as a radio-frequency integrated circuit (RFIC)) may be included as part of the antenna module 8297.

Some of the components may be connected to each other and exchange signals (such as commands or data) by an inter-peripheral communication scheme (such as a bus, general purpose input and output (GPIO), serial peripheral interface (SPI), or mobile industry processor interface (MIPI)).

Commands or data may be transmitted between the electronic device 8201 and the (external) electronic device 8204 through the server 8208 connected to the second network 8299. The other electronic devices 8202 and 8204 and the electronic device 8201 may be the same type of electronic device or may be different types of electronic devices. All or some of operations of the electronic device 8201 may be executed in one or more of the other electronic devices 8202 and 8204, and the server 8208. For example, when the electronic device 8201 needs to perform a certain function or service, the electronic device 8201 may request one or more other electronic devices to perform a part or all of the function or service instead of performing the function or service by itself. The one or more other electronic devices receiving the request may perform an additional function or service related to the request, and may transmit results thereof to the electronic device 8201. To this end, cloud computing, distributed computing, and/or client-server computing techniques may be used.

Figure 30:
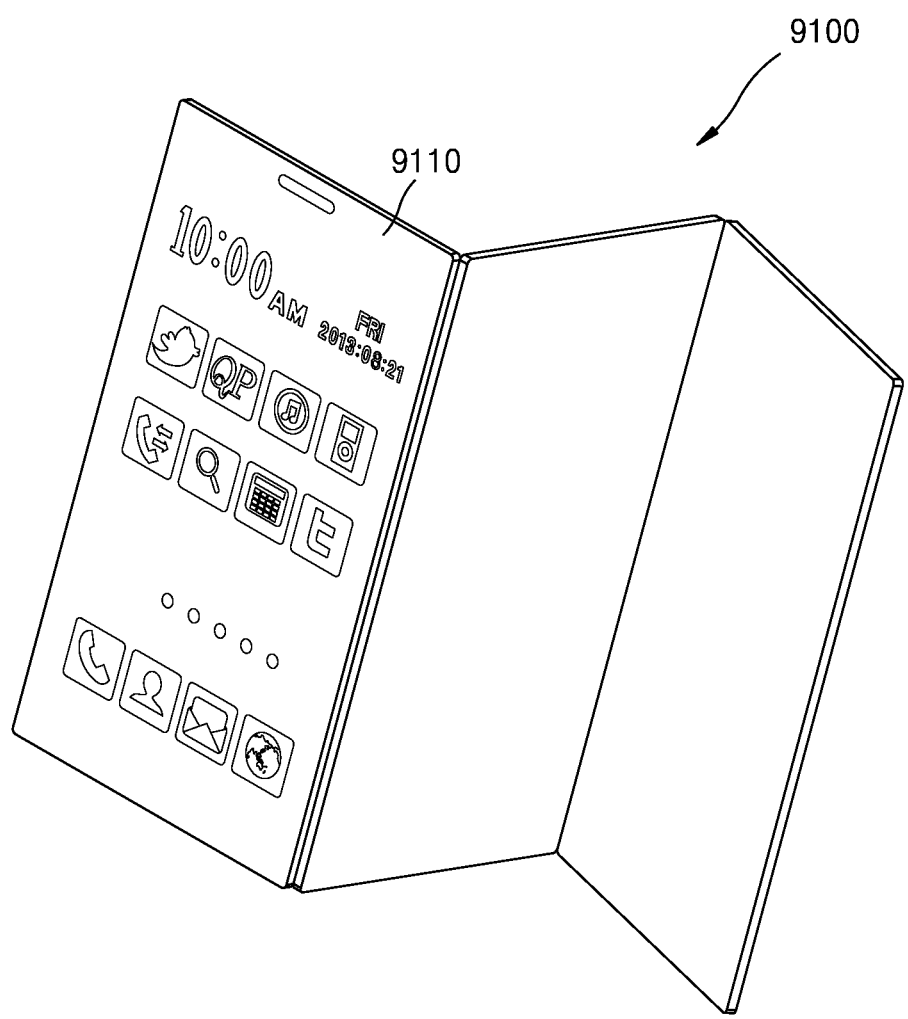
FIG. 30 is a view illustrating an example in which a display apparatus is applied to a mobile device according to an example embodiment.

FIG. 30 is a view illustrating an example in which an electronic device is applied to a mobile device 9100 according to an example embodiment. The mobile device 9100 may include a display apparatus 9110, and the display apparatus 9110 may include the display apparatus 200 described with reference to FIGS. 5 to 8. The display apparatus 9110 may have a foldable structure such as a multi-foldable structure.

Figure 31:
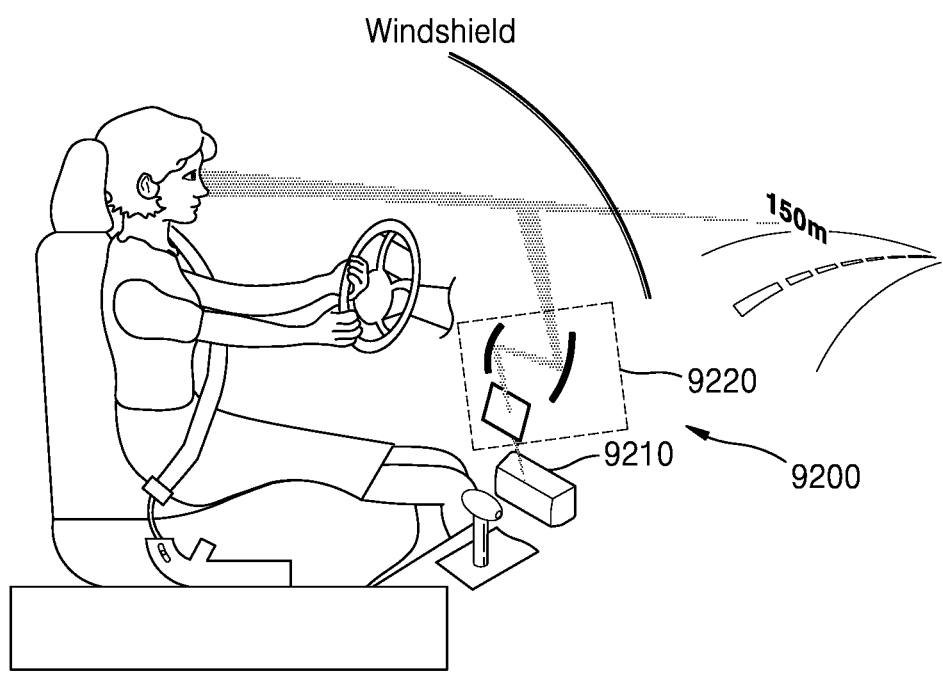
FIG. 31 is a view illustrating an example in which a display apparatus is applied to a vehicular display apparatus according to an example embodiment.

FIG. 31 is a view illustrating an example in which a display apparatus is applied to a vehicle according to an example embodiment. The display apparatus may be a vehicular head-up display apparatus 9200, and may include: a display 9210 provided in an region of the vehicle; and an optical path changing member 9220 configured to change the optical path of light such that a driver may see images generated by the display 9210.

Figure 32:
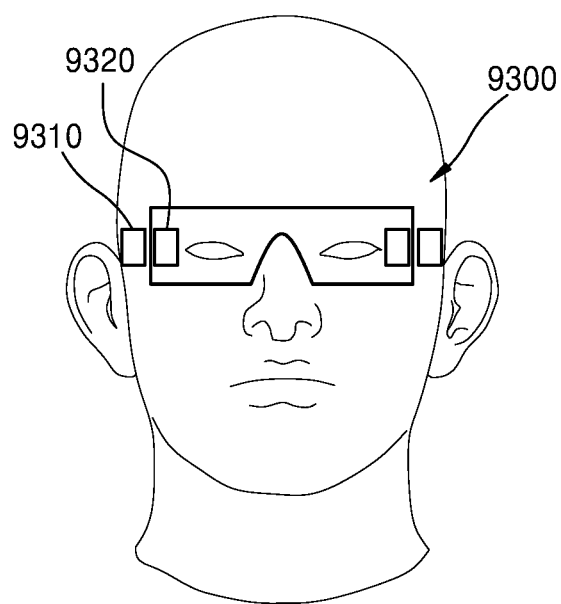
FIG. 32 is a view illustrating an example in which a display apparatus is applied to augmented reality glasses according to an example embodiment.

FIG. 32 is a view illustrating an example in which a display apparatus is applied to augmented reality glasses or virtual reality glasses according to an example embodiment. The augmented reality glasses 9300 may include: a projection system 9310 configured to form images; and elements 9320 configured to guide the images from projection system 9310 into the eyes of a user. The projection system 9310 may include the display apparatus 200 described with reference to FIGS. 5 to 8.

Figure 33:
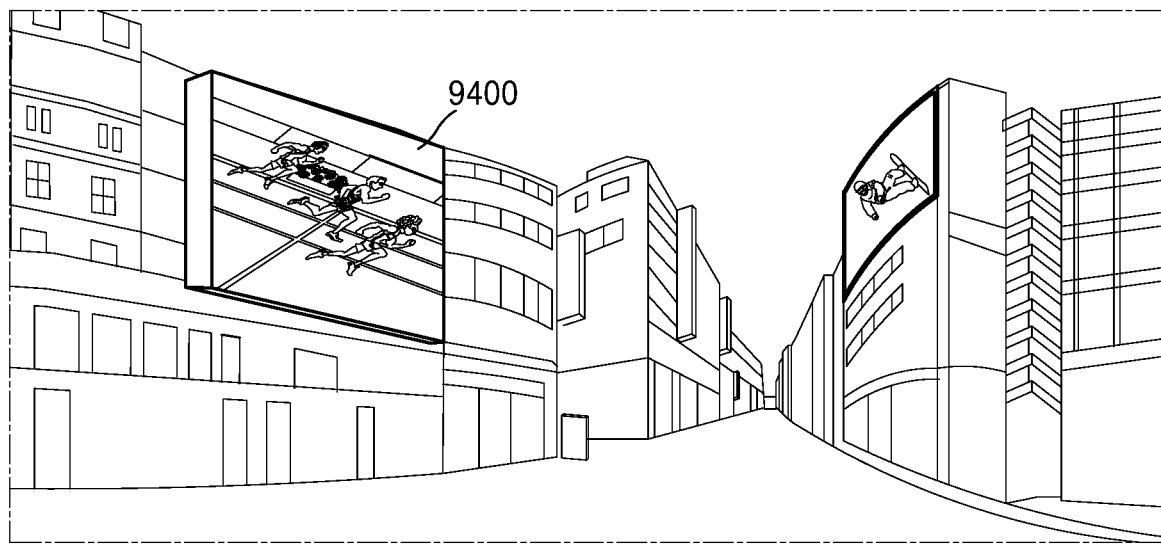
FIG. 33 is a view illustrating an example in which a display apparatus is applied to signage according to an example embodiment.

FIG. 33 is a view illustrating an example in which a display apparatus is applied to large signage 9400 according to an example embodiment. The signage 9400 may be used for outdoor advertisement using a digital information display and may control advertisement content and the like through a communication network. For example, the signage 9400 may be implemented through the electronic device 8201 described with reference to FIG. 29.

Figure 34:
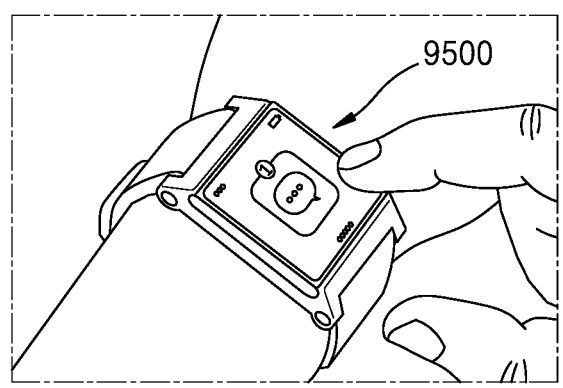
FIG. 34 is a view illustrating an example in which a display apparatus is applied to a wearable display according to an example embodiment.

FIG. 34 is a view illustrating an example in which a display apparatus is applied to a wearable display 9500 according to an example embodiment. The wearable display 9500 may include the display apparatus 200 described with reference to FIGS. 5 to 8 and may be implemented through the electronic device 8201 described with reference to FIG. 29.

The display apparatuses of the example embodiments may be applied to various products such as a rollable TV and a stretchable display.

The color conversion structures of the example embodiments may be efficiently transferred to a display apparatus including micro semiconductor emitting devices. The color conversion structures may be transferred by a fluidic self-assembly method.

The display apparatuses of the example embodiments may efficiently display color images using the color conversion structures. According to the display apparatus manufacturing methods of the example embodiments, the color conversion structures may be easily transferred.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A color conversion structure comprising:
a base layer;
a quantum dot layer provided on the base layer;
a protection layer provided on an upper surface of the quantum dot layer; and
a protrusion provided on an edge of the protection layer,
wherein the protection layer contacts an entire upper surface of the quantum dot layer, and
wherein the protection layer surrounds the quantum dot layer.

2. The color conversion structure of claim 1,
wherein the quantum dot layer comprises:
a porous layer; and
a plurality of quantum dots embedded in the porous layer.

3. The color conversion structure of claim 2,
wherein the porous layer comprises n-GaN.

4. The color conversion structure of claim 1,
wherein the base layer has a first width equal to a second width of the quantum dot layer.

5. The color conversion structure of claim 1,
wherein the quantum dot layer comprises a first surface facing the base layer, a second surface opposite to the first surface, and a third surface forming a lateral surface between the first surface and the second surface, and
wherein the protrusion is provided in a region corresponding to an edge of the second surface of the quantum dot layer or in a region corresponding to the edge of the second surface and the third surface of the quantum dot layer.

6. The color conversion structure of claim 1,
wherein the quantum dot layer comprises a first surface facing the base layer and a second surface opposite to the first surface, and
wherein the protrusion comprises a pattern provided in a region corresponding to the second surface.

7. The color conversion structure of claim 1,
wherein the base layer comprises SiO2, SiN, or GaN.

8. The color conversion structure of claim 1, further comprising:
a concave-convex pattern provided on the protection layer.

9. The color conversion structure of claim 1, further comprising:
a protrusion provided on the protection layer, the protrusion extending from an edge of the protection layer along a side surface of the quantum dot layer.

10. A display apparatus comprising:
a display substrate;
a plurality of barrier ribs provided on the display substrate, the plurality of barrier ribs being spaced apart from each other;
a micro semiconductor emitting device provided in a groove defined by adjacent barrier ribs among the plurality of barrier ribs; and
a color conversion structure provided on the micro semiconductor emitting device, the color conversion structure comprising:
a base layer,
a quantum dot layer provided on the base layer, and
a protection layer surrounding the quantum dot layer.

11. The display apparatus of claim 10,
wherein the quantum dot layer comprises:
a porous layer; and
a plurality of quantum dots embedded in the porous layer.

12. The display apparatus of claim 11,
wherein the porous layer comprises n-GaN.

13. The display apparatus of claim 10,
wherein the base layer has a first width equal to a second width of the quantum dot layer.

14. The display apparatus of claim 10,
wherein the protection layer is provided on side surfaces of the quantum dot layer and an entire upper surface of the quantum dot layer.

15. The color conversion structure of claim 10, further comprising a protrusion provided on an edge of the protection layer.

16. The display apparatus of claim 10,
wherein the color conversion structure further comprises a protrusion provided on the quantum dot layer.

17. The display apparatus of claim 16,
wherein the quantum dot layer comprises a first surface facing the base layer, a second surface opposite to the first surface, and a third surface forming a lateral surface between the first surface and the second surface, and
wherein the protrusion is provided in a region corresponding to an edge of the second surface of the quantum dot layer or in a region corresponding to the edge of the second surface and the third surface of the quantum dot layer.

18. The display apparatus of claim 16,
wherein the quantum dot layer comprises a first surface facing the base layer and a second surface opposite to the first surface, and
wherein the protrusion comprises a pattern provided in a region corresponding to the second surface.

19. The display apparatus of claim 10,
wherein the base layer comprises SiO2, SiN, or GaN.

20. The display apparatus of claim 10,
wherein the groove comprises a first groove, a second groove, and a third groove, and
wherein the first groove, the second groove, and the third groove have different cross-sectional shapes or different cross-sectional sizes from one another.

21. The display apparatus of claim 10,
wherein the color conversion structure is spaced apart from the barrier ribs with a gap between the color conversion structure and from the barrier ribs.

22. The display apparatus of claim 10,
wherein the base layer is arranged toward the micro semiconductor emitting device.

23. The display apparatus of claim 10,
wherein the micro semiconductor emitting device includes a micro light emitting diode or an organic light emitting diode.

24. The display apparatus of claim 10, wherein the protection layer is provided between the adjacent barrier ribs and quantum dot layer.

25. A color conversion structure comprising:
a quantum dot layer;

a base layer provided on the quantum dot layer, the base layer configured to separate the quantum dot layer from a micro semiconductor emitting device;

a protection layer which surrounds the quantum dot layer; and a protrusion provided on the protection layer, the protrusion extending from an edge of the protection layer along a side surface of the quantum dot layer, wherein the protection layer contacts an entire upper surface of the quantum dot layer.

* * * * *